(12) United States Patent
Koda et al.

(10) Patent No.: US 8,896,002 B2
(45) Date of Patent: Nov. 25, 2014

(54) METHOD FOR PRODUCING SEMICONDUCTOR LASER, SEMICONDUCTOR LASER, OPTICAL PICKUP, AND OPTICAL DISK DRIVE

(75) Inventors: Rintaro Koda, Tokyo (JP); Masaru Kuramoto, Kanagawa (JP); Eiji Nakayama, Miyagi (JP); Tsuyoshi Fujimoto, Kanagawa (JP)

(73) Assignee: Sony Corporation, Tokyo (JP)

(*) Notice: Subject to any disclaimer, the term of this patent is extended or adjusted under 35 U.S.C. 154(b) by 910 days.

(21) Appl. No.: 12/568,855

(22) Filed: Sep. 29, 2009

(65) Prior Publication Data

US 2010/0080107 A1    Apr. 1, 2010

(30) Foreign Application Priority Data

Sep. 30, 2008 (JP) .................. 2008-252364

(51) Int. Cl.
*H01L 33/00* (2010.01)
*B82Y 20/00* (2011.01)
(Continued)

(52) U.S. Cl.
CPC ............. *H01S 5/16* (2013.01); *H01S 5/2277* (2013.01); *H01S 5/168* (2013.01); *H01S 5/34333* (2013.01); *B82Y 20/00* (2013.01); *H01S 5/2275* (2013.01)
USPC .............. 257/94; 257/91; 257/82; 257/615; 257/E21.134; 257/E21.257

(58) Field of Classification Search
CPC ............. H01L 21/02354; H01L 21/2026; H01L 2021/60112; H01L 21/027; H01L 21/0465; H01L 21/266; H01L 21/308; H01L 21/32; H01L 21/02104; H01L 21/02293; H01L 39/2458; H01S 1/00; H01S 5/323
USPC ........ 257/13, 79, E33.023, E33.045, 11, 183, 257/613, 615, E33.049, E21.028, E21.134, 257/E21.231, E21.257, E21.258, E21.314, 257/E21.346, 88, 91, 94
See application file for complete search history.

(56) References Cited

U.S. PATENT DOCUMENTS 6,475,820 B2 * 11/2002 Nakajima et al. ............... 438/46
6,656,615 B2    12/2003 Dwilinski et al.
(Continued)

FOREIGN PATENT DOCUMENTS

JP    06-260727    9/1994
JP    07-235722    9/1995
(Continued)

OTHER PUBLICATIONS

Joyner et al. Extremely large Band Gap Shifts for MQW Structures by Selective Epitaxy on SiO2 Masked Substrates. IEEE Photonics Technology Letters, vol. 4, No (, Sep. 1992, pp. 1006-1008.*
(Continued)

*Primary Examiner* — Galina Yushina
(74) *Attorney, Agent, or Firm* — Dentons US LLP

(57) ABSTRACT

A method for producing a semiconductor laser having an edge window structure includes the steps of forming masks of insulating films on a nitride-based III-V compound semiconductor substrate including first regions and second regions periodically arranged in parallel therebetween; and growing a nitride-based III-V compound semiconductor layer in a region not covered by the masks. The first region between each two adjacent second regions has two or more positions, symmetrical with respect to a center line thereof, where laser stripes are to be formed. The masks are formed on one or both sides of each of the positions where the laser stripes are to be formed at least near a position where edge window structures are to be formed such that the masks are symmetrical with respect to the center line. The nitride-based III-V compound semiconductor layer includes an active layer containing at least indium and gallium.

12 Claims, 23 Drawing Sheets

(51) Int. Cl.
*H01S 5/323* (2006.01)
*H01S 5/227* (2006.01)
*H01S 5/16* (2006.01)
*H01S 5/343* (2006.01)

(56) References Cited

U.S. PATENT DOCUMENTS

| | | | |
|---|---|---|---|
| 6,958,493 | B2 | 10/2005 | Hasegawa et al. |
| 7,176,499 | B2 | 2/2007 | Asatsuma et al. |
| 7,430,228 | B2 | 9/2008 | Ohkubo |
| 2003/0026180 | A1* | 2/2003 | Shidara ............... 369/47.4 |
| 2004/0164308 | A1* | 8/2004 | Asatsuma et al. ........ 257/94 |
| 2004/0245540 | A1* | 12/2004 | Hata et al. ............... 257/99 |
| 2005/0220157 | A1 | 10/2005 | Nakamura et al. |
| 2008/0240190 | A1* | 10/2008 | Kuramoto et al. ..... 372/44.01 |

FOREIGN PATENT DOCUMENTS

| | | |
|---|---|---|
| JP | 07-302952 | 11/1995 |
| JP | 08-307005 | 11/1996 |
| JP | 2000-196188 | 7/2000 |
| JP | 2002-204036 | 7/2002 |
| JP | 2003-036771 | 2/2003 |
| JP | 2003-060298 | 2/2003 |
| JP | 2003-124572 | 4/2003 |
| JP | 2003-198057 | 7/2003 |
| JP | 2003-133649 | 9/2003 |
| JP | 2004-134555 | 4/2004 |
| JP | 2005-033077 | 2/2005 |
| JP | 2005-045009 | 2/2005 |
| JP | 2005-191588 | 7/2005 |
| JP | 2005-294394 | 10/2005 |
| JP | 2006-147814 | 6/2006 |
| JP | 2006-147815 | 6/2006 |
| JP | 2006-216772 | 8/2006 |
| JP | 2008-034587 | 2/2008 |

OTHER PUBLICATIONS

Japanese Patent Office Action corresponding to Japanese Serial No. 2008-252364 dated Sep. 7, 2010.

Japanese Office Action issued on Aug. 16, 2011 in connection with counterpart JP Application No. 2008-252364.

* cited by examiner

MICROPHOTOLUMINESCENCE
EXCITATION LIGHT

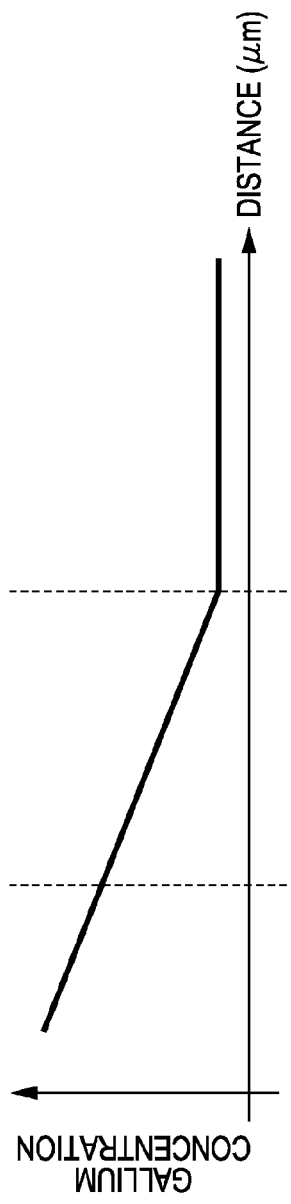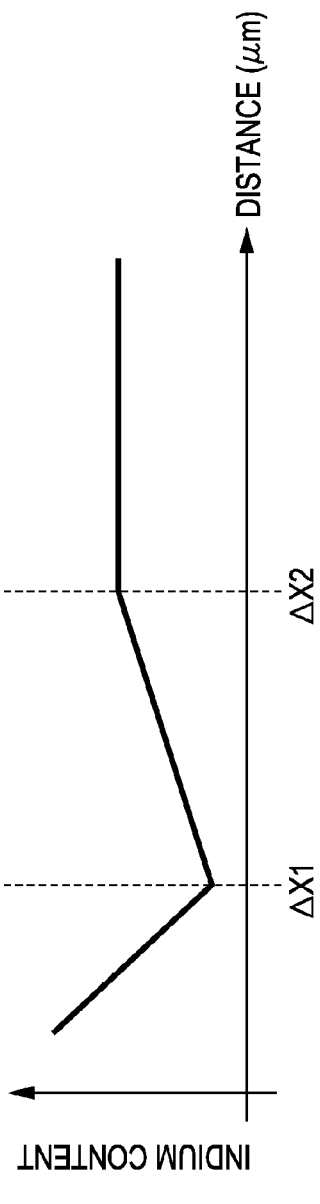

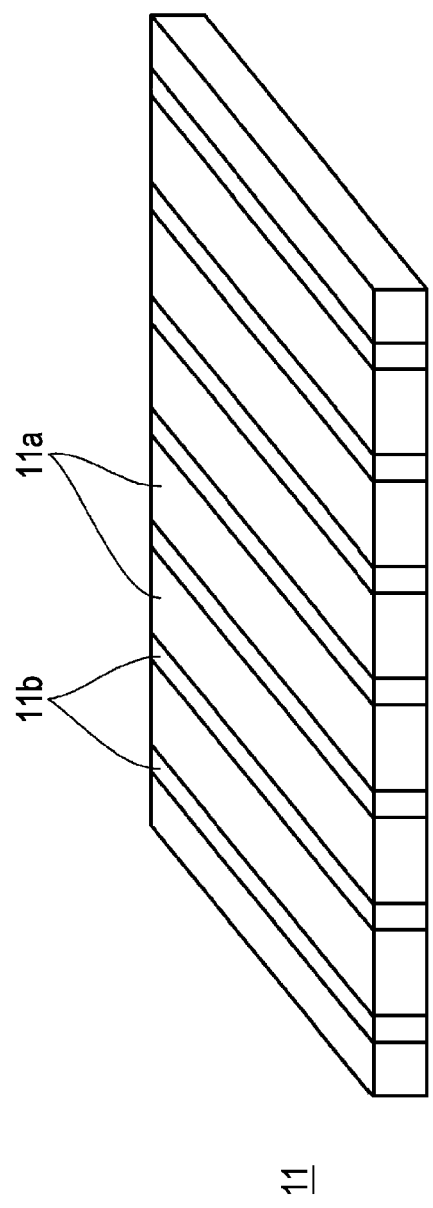
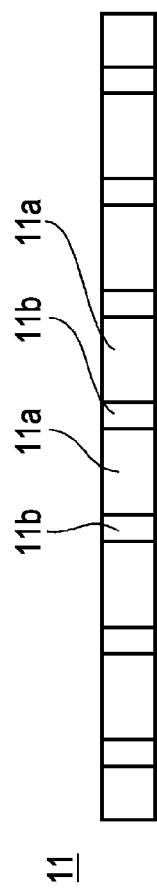
FIG. 8A
FIG. 8B

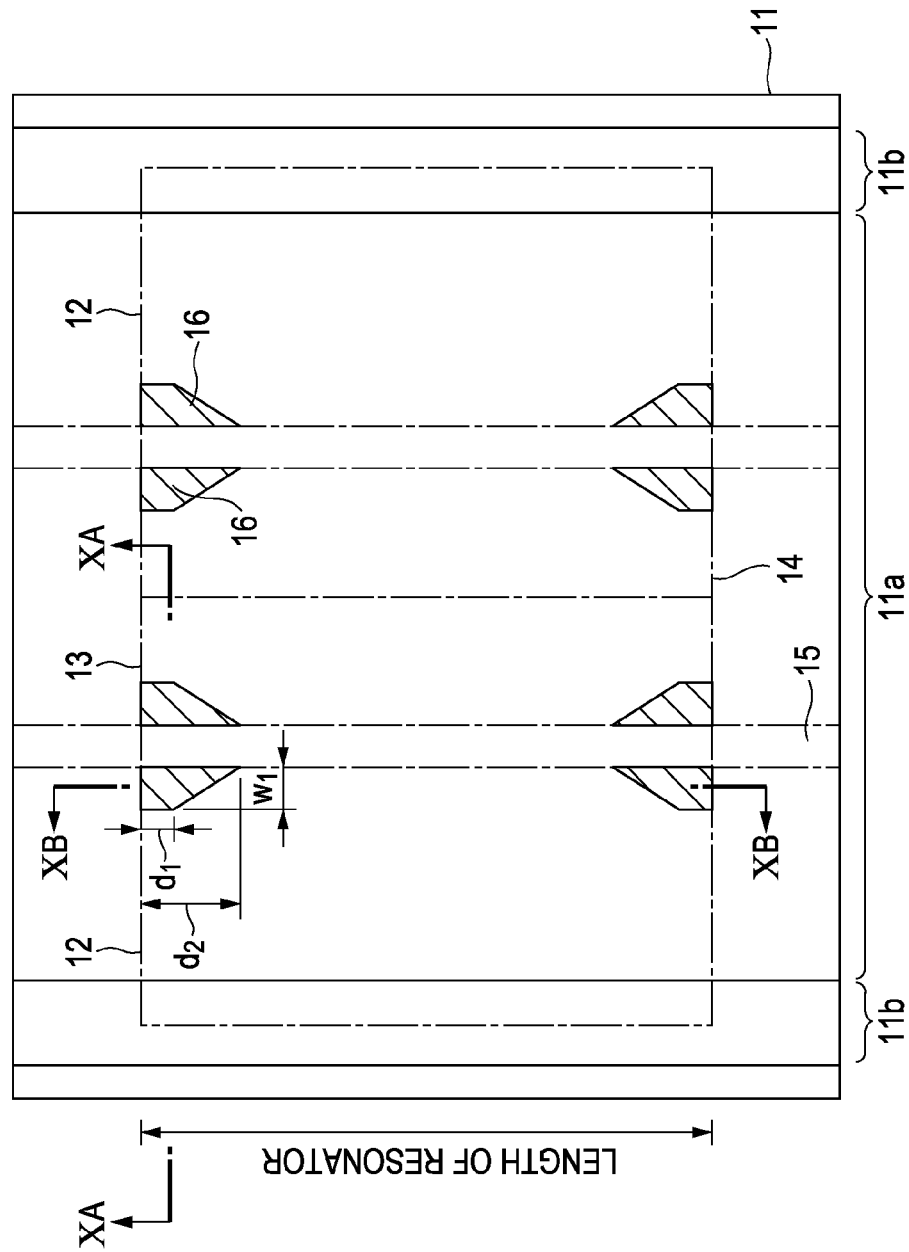

METHOD FOR PRODUCING SEMICONDUCTOR LASER, SEMICONDUCTOR LASER, OPTICAL PICKUP, AND OPTICAL DISK DRIVE

BACKGROUND OF THE INVENTION

1. Field of the Invention

The present invention relates to methods for producing semiconductor lasers, semiconductor lasers, optical pickups, and optical disk drives. More specifically, the present invention is suitable for application to, for example, ridge-stripe semiconductor lasers with an edge window structure using nitride-based III-V compound semiconductors and optical pickups and optical disk drives using such semiconductor lasers as light sources.

2. Description of the Related Art

To increase the maximum optical output of a semiconductor laser, it is effective to introduce an edge window structure where a window transparent to light emitted from an active layer is provided at an edge of a resonator.

For GaInP-based red light-emitting semiconductor lasers, it is effective to form an edge window structure by diffusing zinc atoms into a semiconductor layer forming a laser structure near a position corresponding to an edge of a resonator after the growth of the semiconductor layer (see, for example, Japanese Unexamined Patent Application Publication No. 2005-45009 (Patent Document 1)). In this case, the edge window structure is formed by diffusing zinc atoms into the semiconductor layer near the position corresponding to the edge of the resonator so that the bandgap energy thereof can be locally increased.

Recent high-density optical disk drives include semiconductor lasers using nitride-based III-V compound semiconductors as light sources. Most nitride-based III-V compound semiconductors are more thermally and mechanically stable than GaInP-based semiconductors. Consequently, it is difficult to form an edge window structure in a semiconductor laser using a nitride-based III-V compound semiconductor by diffusion of foreign atoms and wet etching, which are effective for GaInP-based red light-emitting semiconductor lasers.

Accordingly, various proposals and experiments have so far been made as to methods for forming an edge window structure in a semiconductor laser using a nitride-based III-V compound semiconductor. Methods proposed so far for forming an edge window structure will be described below.

According to some proposed methods, after a laser bar is formed by cleavage, an edge window structure is formed by increasing the bandgap energy near an edge of a resonator by removing indium through exposure to hydrogen plasma or laser irradiation (see, for example, Japanese Unexamined Patent Application Publication Nos. 2006-147814 (Patent Document 2) and 2006-147815 (Patent Document 3)). These methods, however, result in significant capital investment because they use a high-vacuum chamber apparatus, and are also generally disadvantageous in terms of productivity because the edge of the resonator is processed after the cleavage.

Many proposals have been made as to the following method (see, for example, Japanese Unexamined Patent Application Publication Nos. 2004-134555 (Patent Document 4) and 2003-60298 (Patent Document 5), PCT International Publication No. WO 03/036771 (Patent Document 6), and Japanese Unexamined Patent Application Publication No. 2002-204036 (Patent Document 7)). Specifically, first, a semiconductor layer forming a laser structure is epitaxially grown on a substrate. A portion of the semiconductor layer corresponding to an edge of a resonator is then etched by reactive ion etching (RIE). Subsequently, a nitride-based III-V compound semiconductor layer with a large bandgap energy is epitaxially grown on the etched portion. In this method, however, light absorption and local heat generation may occur during laser operation because a surface level appears at the surface etched by RIE.

Another example is a method of forming an edge window structure by epitaxially growing a semiconductor layer forming a laser structure on a substrate having geometrical steps formed by RIE or insulating film deposition (see, for example, Japanese Unexamined Patent Application Publication Nos. 2005-191588 (Patent Document 8), 2005-294394 (Patent Document 9), 2003-198057 (Patent Document 10), and 2000-196188 (Patent Document 11)). This method is intended to use a cladding layer with a larger bandgap energy than an active layer as an edge window structure in a direction in which laser light travels. A typical example is shown in FIG. 25. In FIG. 25, a recess 101a is formed in a main surface of a substrate 101 by RIE patterning. An n-type semiconductor layer 102, an active layer 103, and a p-type semiconductor layer 104 are sequentially grown on the substrate 101, and a p-side electrode 105, an isolation electrode 106, and a pad electrode 107 are formed on the p-type semiconductor layer 104. This method, however, has the following problem. The recess 101a in the substrate 101 forms steep geometrical steps in the n-type semiconductor layer 102, the active layer 103, and the p-type semiconductor layer 104, thus causing waveguide loss near the steps. In addition, this structure may not function as an effective edge window structure because it is not intended to form a transparent region by widening the bandgap of the active layer 103 near the edge of the resonator.

According to another example of the related art, semiconductor lasers are produced using a nitride-based III-V compound semiconductor substrate including a first region formed of a single crystal and having a first average dislocation density and second regions arranged in the first region and having a second average dislocation density higher than the first average dislocation density (see, for example, Japanese Unexamined Patent Application Publication No. 2003-124572 (Patent Document 12)). An example of such a nitride-based III-V compound semiconductor substrate is one including a first region formed of a single crystal and having a first average dislocation density and second regions having a second average dislocation density higher than the first average dislocation density and periodically arranged in parallel in the first region so as to extend linearly. When a nitride-based III-V compound semiconductor layer forming a laser structure is grown on the nitride-based III-V compound semiconductor substrate, the second regions of the nitride-based III-V compound semiconductor substrate are transcribed in the nitride-based III-V compound semiconductor layer. Laser chip regions are defined on the nitride-based III-V compound semiconductor substrate so that the second regions are not included in laser stripes.

SUMMARY OF THE INVENTION

As described above, the methods of the related art for forming an edge window structure in a semiconductor laser using a nitride-based III-V compound semiconductor have many problems.

Accordingly, it is desirable to provide a method for producing a semiconductor laser using a nitride-based III-V compound semiconductor in which an edge window structure can be easily formed and also to provide such a semiconductor laser.

In addition, it is desirable to provide a method for producing a semiconductor laser using a nitride-based III-V compound semiconductor in which waveguide loss can be suppressed and also to provide such a semiconductor laser.

In addition, it is desirable to provide a method for producing a semiconductor laser using a nitride-based III-V compound semiconductor in which light absorption and local heat generation due to a surface level during laser operation can be suppressed and also to provide such a semiconductor laser.

In addition, it is desirable to provide a method for producing a larger number of semiconductor lasers using a nitride-based III-V compound semiconductor from a single nitride-based III-V compound semiconductor substrate and also to provide such a semiconductor laser.

In addition, it is desirable to provide an optical pickup and an optical disk drive using a superior semiconductor laser described above as a light source.

The inventors have made an intensive study summarized as follows. Specifically, a nitride-based III-V compound semiconductor layer containing at least indium and gallium, such as an InGaN layer, is grown on a substrate on which insulating film masks are formed in advance. The inventors have found that the bandgap energy of the nitride-based III-V compound semiconductor layer can be controlled at an intended position by selecting the width, interval, shape, position, and so on of the insulating film masks. By this method for controlling the bandgap energy, an edge window structure can be easily formed. On the other hand, as described above, if the nitride-based III-V compound semiconductor substrate disclosed in Patent Document 12 is used to produce semiconductor lasers, laser chip regions are defined so that the second regions are not included in laser stripes. The inventors have studied a method for most efficiently utilizing the area of the nitride-based III-V compound semiconductor substrate to increase the number of laser chips yielded. As a result, the inventors have concluded that it is desirable to include two or more laser chip regions between each two adjacent second regions extending linearly. Based on the above studies and findings, the present invention has been made as a result of detailed research from various viewpoints.

That is, a method according to an embodiment of the present invention for producing a semiconductor laser having an edge window structure includes the steps of forming masks of insulating films on a nitride-based III-V compound semiconductor substrate; and growing a nitride-based III-V compound semiconductor layer in a region not covered by the masks on the nitride-based III-V compound semiconductor substrate. The nitride-based III-V compound semiconductor substrate includes first regions formed of single crystals and having a first average dislocation density and second regions having a second average dislocation density higher than the first average dislocation density and periodically arranged in parallel between the first regions so as to extend linearly. The first region between each two adjacent second regions has two or more positions, symmetrical with respect to a center line thereof, where laser stripes are to be formed. The masks are formed on one or both sides of each of the positions where the laser stripes are to be formed at least near a position where edge window structures are to be formed such that the masks are symmetrical with respect to the center line. The nitride-based III-V compound semiconductor layer includes an active layer of a nitride-based III-V compound semiconductor containing at least indium and gallium.

The positions where the laser stripes are to be formed refer to stripe-shaped regions including images, projected on the nitride-based III-V compound semiconductor substrate, of the laser stripes to be finally formed in the nitride-based III-V compound semiconductor layer. The laser stripes are formed on the center lines of the positions where the laser stripes are to be formed. The width of the laser stripes is smaller than or equal to the width of the positions where the laser stripes are to be formed. The laser stripes are typically, but not limited to, ridge stripes.

A semiconductor laser having an edge window structure according to another embodiment of the present invention includes a nitride-based III-V compound semiconductor substrate including a first region formed of a single crystal and having a first average dislocation density and a second region having a second average dislocation density higher than the first average dislocation density and disposed along a side parallel to a resonator length direction; a mask of an insulating film disposed on the nitride-based III-V compound semiconductor substrate at least near a position corresponding to an edge window structure; and a nitride-based III-V compound semiconductor layer including an active layer and grown in a region not covered by the mask on the nitride-based III-V compound semiconductor substrate.

While the nitride-based III-V compound semiconductor substrate in the previous embodiment is a wafer, the nitride-based III-V compound semiconductor substrate in this embodiment has the shape of a laser chip.

An optical pickup according to another embodiment of the present invention includes a semiconductor laser having an edge window structure as a light source. The semiconductor laser includes a nitride-based III-V compound semiconductor substrate including a first region formed of a single crystal and having a first average dislocation density and a second region having a second average dislocation density higher than the first average dislocation density and disposed along a side parallel to a resonator length direction; a mask of an insulating film disposed on the nitride-based III-V compound semiconductor substrate at least near a position corresponding to an edge window structure; and a nitride-based III-V compound semiconductor layer including an active layer and grown in a region not covered by the mask on the nitride-based III-V compound semiconductor substrate.

An optical disk drive according to another embodiment of the present invention includes a semiconductor laser having an edge window structure as a light source. The semiconductor laser includes a nitride-based III-V compound semiconductor substrate including a first region formed of a single crystal and having a first average dislocation density and a second region having a second average dislocation density higher than the first average dislocation density and disposed along a side parallel to a resonator length direction; a mask of an insulating film disposed on the nitride-based III-V compound semiconductor substrate at least near a position corresponding to an edge window structure; and a nitride-based III-V compound semiconductor layer including an active layer and grown in a region not covered by the mask on the nitride-based III-V compound semiconductor substrate.

The nitride-based III-V compound semiconductor used is most generally $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, and $0 \leq u+v<1$). More specifically, the nitride-based III-V compound semiconductor used is $Al_xB_yGa_{1-x-y-z}In_zN$ (where $0 \leq x \leq 1$, $0 \leq y \leq 1$, $0 \leq z \leq 1$, and $0 \leq x+y+z<1$), typically $Al_xGa_{1-x-z}In_zN$ (where $0 \leq x \leq 1$ and $0 \leq z \leq 1$). Specific examples of the nitride-based III-V compound semiconductor include, but not limited to, GaN, InN, AlN, AlGaN, InGaN, and AlGaInN. The nitride-based III-V compound semiconductor containing at least indium and gallium is $Al_xB_yGa_{1-x-y-z}In_zAs_uN_{1-u-v}P_v$ (where $0 \leq x \leq 1$, $0 \leq y \leq 1$, $0<z \leq 1$, $0 \leq u \leq 1$, $0 \leq v \leq 1$, $0 \leq x+y+z<1$, and $0 \leq u+v<1$). More specifically, the nitride-based III-V compound semiconductor containing at least indium and gallium is $Al_xB_yGa_{1-x-y-z}In_zN$ (where $0 \leq x \leq 1$, $0 \leq y \leq 1$, $0 < z \leq 1$, and $0 \leq x+y+z < 1$). Typically, the nitride-based III-V compound semiconductor containing at least indium and gallium is $Al_xGa_{1-x-z}In_zN$ (where $0 \leq x \leq 1$ and $0 < z \leq 1$). Specific examples include InGaN and AlGaInN. The nitride-based III-V compound semiconductor layers can be grown by various epitaxy processes. The epitaxy process used is typically, but not limited to, metal-organic chemical vapor deposition (MOCVD), hydride vapor phase epitaxy or halide vapor phase epitaxy (HVPE), and molecular beam epitaxy (MBE).

In the above embodiments, a mask of an insulating film is formed on a nitride-based III-V compound semiconductor substrate at least near a position where an edge window structure is to be formed, and an active layer is grown in a region not covered by the mask. Because the diffusion distance of indium is significantly smaller than that of gallium, the indium content of the active layer is lower near the position where the edge window structure is to be formed than in other regions. Unlike in the related art, therefore, the edge window structure can be formed without forming a recess on the substrate. In addition, an appropriately selected mask shape prevents formation of steep steps in the nitride-based III-V compound semiconductor layer including the active layer, thus suppressing waveguide loss. In addition, no surface level appears because the edge window structure can be formed without etching the portion of the semiconductor layer forming the edge window structure by RIE, thus preventing light absorption and local heat generation during laser operation. In addition, the area of the nitride-based III-V compound semiconductor substrate can be efficiently utilized because two or more laser chip regions are defined between two adjacent second regions.

In addition, a pad electrode is formed in a region on the side of a laser stripe facing away from the mask so as to be electrically connected to the laser stripe. This prevents, for example, breakage of the pad electrode at a step. Specifically, a recess is formed above the mask after the growth of the nitride-based III-V compound semiconductor layer. If the pad electrode is formed in a region on the side of the laser stripe facing the mask, the pad electrode may be, for example, broken at a step in the recess above the mask. In contrast, because the surface in the region on the side of the laser stripe facing away from the mask is substantially flat, the pad electrode can be formed in the substantially flat region without the risk of, for example, breakage of the pad electrode at a step.

According to the above embodiments, it is possible to provide a semiconductor laser using a nitride-based III-V compound semiconductor in which an edge window structure can be easily formed, in which waveguide loss can be suppressed, and in which light absorption and local heat generation during laser operation can be suppressed. In addition, a larger number of semiconductor lasers can be produced from a single nitride-based III-V compound semiconductor substrate. In addition, the superior semiconductor laser can be used as a light source for an optical pickup to provide an optical disk drive with high performance.

BRIEF DESCRIPTION OF THE DRAWINGS

FIGS. 5A, 5B, and 5C are graphs showing the distributions of the gallium concentration, the indium concentration, and the indium content, respectively, of InGaN layers grown on the samples used for the basic research conducted by the inventors;

FIGS. 8A and 8B are a perspective view and a sectional view, respectively, showing an n-type GaN substrate used in a method for producing a GaN-based semiconductor laser according to a first embodiment of the present invention;

FIG. 9 is a plan view showing the method for producing a GaN-based semiconductor laser according to the first embodiment of the present invention;

DESCRIPTION OF THE PREFERRED EMBODIMENTS

Preferred embodiments of the present invention will now be described. The description will be given in the following order:

1. Findings Obtained by Inventors to Provide Basis for Embodiments
2. First Embodiment (Semiconductor Laser and Method for Producing Semiconductor Laser)
3. Second Embodiment (Semiconductor Laser and Method for Producing Semiconductor Laser)
4. Third Embodiment (Semiconductor Laser and Method for Producing Semiconductor Laser)
5. Fourth Embodiment (Semiconductor Laser and Method for Producing Semiconductor Laser)
6. Fifth Embodiment (Semiconductor Laser and Method for Producing Semiconductor Laser)
7. Sixth Embodiment (Semiconductor Laser and Method for Producing Semiconductor Laser)
8. Seventh Embodiment (Semiconductor Laser and Method for Producing Semiconductor Laser)
9. Eighth Embodiment (Semiconductor Laser and Method for Producing Semiconductor Laser)
10. Ninth Embodiment (Semiconductor Laser and Method for Producing Semiconductor Laser)
11. Tenth Embodiment (Semiconductor Laser and Method for Producing Semiconductor Laser)
12. Eleventh Embodiment (Semiconductor Laser and Method for Producing Semiconductor Laser)
13. Twelfth Embodiment (Semiconductor Laser and Method for Producing Semiconductor Laser)

1. Findings Obtained by Inventors to Provide Basis for Embodiments

The findings obtained by the inventors will be described below.

The inventors conducted the following experiment for basic research.

Figure 1A:
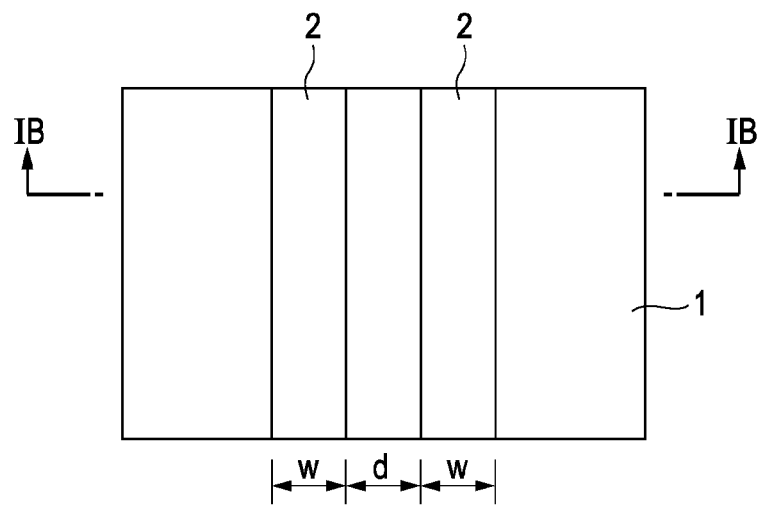
FIGS. 1A and 1B are a plan view and a sectional view, respectively, showing a sample used for basic research conducted by the inventors.
Figure 1B:
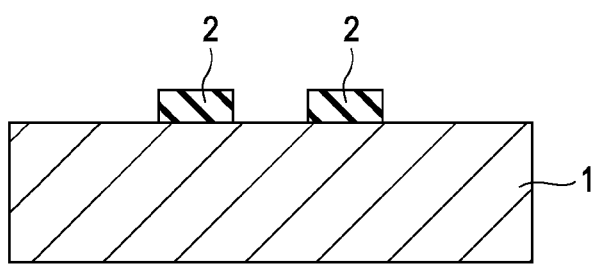

As shown in FIGS. 1A and 1B, two stripe-shaped $SiO_2$ film masks 2 with a width w were formed in parallel at an interval d on an n-type GaN substrate 1. FIG. 1A is a plan view, and FIG. 1B is a sectional view taken along line IB-IB in FIG. 1A.

Figure 2A:
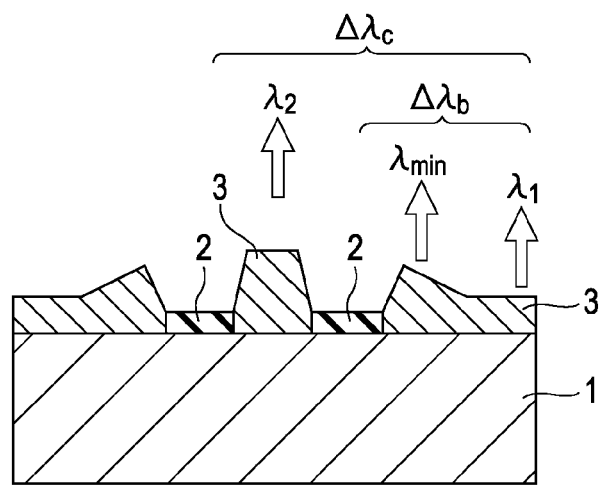
FIGS. 2A and 2B are sectional views showing the sample used for the basic research conducted by the inventors.
Figure 2B:
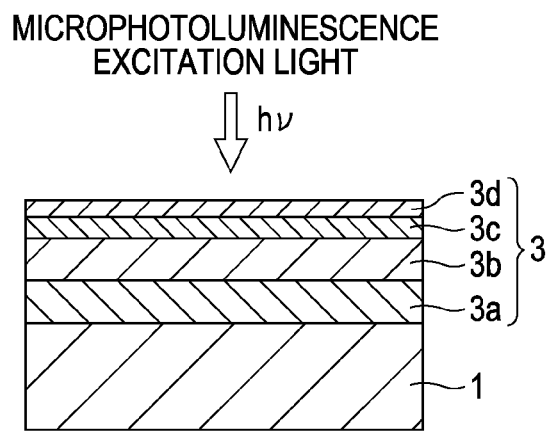

As shown in FIGS. 2A and 2B, a GaN-based semiconductor layer 3 constituting part of a layer forming a laser structure of a GaN-based semiconductor laser was epitaxially grown on the n-type GaN substrate 1 with the $SiO_2$ film masks 2.

The GaN-based semiconductor layer 3 included an n-type AlGaN cladding layer 3a, an n-type GaN waveguide layer 3b, an active layer 3c with an undoped $Ga_{1-x}In_xN$ (quantum well layer)/$Ga_{1-y}In_yN$ (barrier layer) multiple quantum well structure (where x>y), and an undoped InGaN waveguide layer 3d.

The layers containing no indium, namely, the n-type AlGaN cladding layer 3a and the n-type GaN waveguide layer 3b, were grown at, for example, 900° C. to 1100° C.

The layers containing indium, namely, the active layer 3c with a $Ga_{1-x}In_xN/Ga_{1-y}In_yN$ multiple quantum well structure and the undoped InGaN waveguide layer 3d, were grown at, for example, 700° C. to 800° C.

The GaN-based semiconductor layer 3 did not substantially grow on the $SiO_2$ film masks 2, but only in regions not covered by the $SiO_2$ film masks 2 on the n-type GaN substrate 1.

The samples thus prepared were irradiated with excitation light (hv) for evaluation of the perk energy of light emitted from the active layer 3c by microphotoluminescence spectroscopy (see FIG. 2B).

Figure 3:
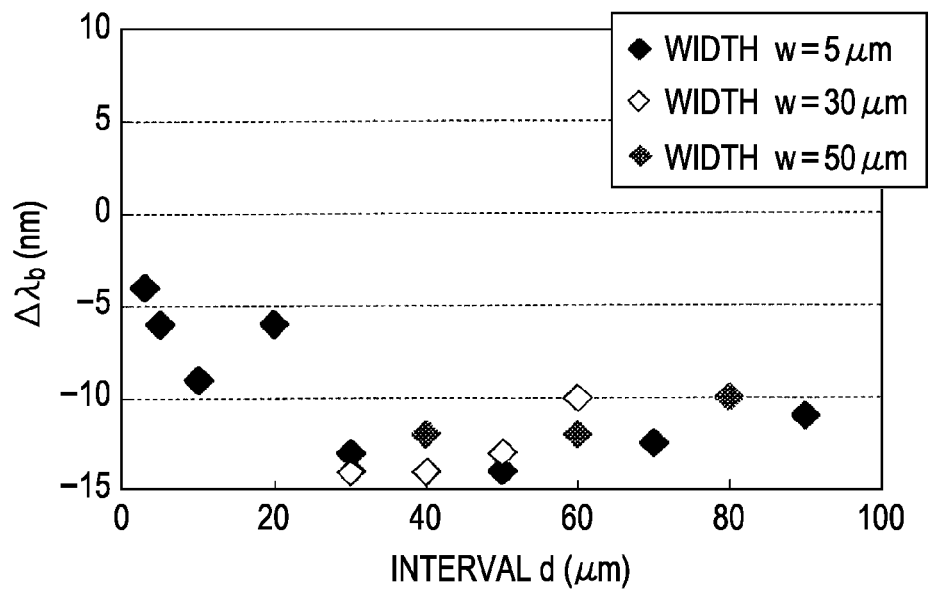
FIG. 3 is a graph showing variations in emission wavelength for varying widths and intervals of $SiO_2$ film masks on samples used for the basic research conducted by the inventors.
Figure 4:
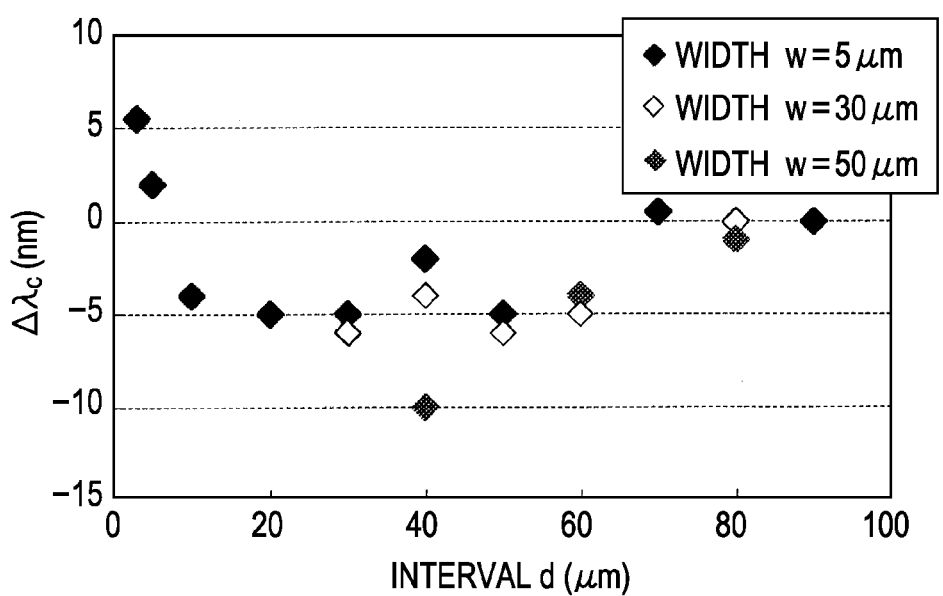
FIG. 4 is a graph showing variations in emission wavelength for varying widths and intervals of the $SiO_2$ film masks on the samples used for the basic research conducted by the inventors.

This experiment yielded basic data about the dependence of the perk energy of the light emitted from the active layer 3c on the width w and the interval d of the $SiO_2$ film masks 2. FIGS. 3 and 4 show the measurement results.

The symbol $\Delta\lambda_b$ for the vertical axis of the graph shown in FIG. 3 is defined as follows. The wavelength corresponding to the perk energy of the light emitted from a flat portion, sufficiently far away from the $SiO_2$ film masks 2, of the active layer 3c in the GaN-based semiconductor layer 3 is referred to as $\lambda_1$ (see FIG. 2A).

The wavelength corresponding to the peak energy of the emitted light shifted to the shorter wavelength side and then back to the longer wavelength side in a direction away from the $SiO_2$ film masks 2. The shortest wavelength corresponding to the maximum peak energy is referred to as $\lambda_{min}$, where $\Delta\lambda_b$ is defined as follows: $\Delta\lambda_b = \lambda_{min} - \lambda_1$.

FIG. 3 shows variations in $\Delta\lambda_b$ for varying intervals d between the $SiO_2$ film masks 2 with the width w fixed. The width w was changed between three levels, namely, 5 μm, 30 μm, and 50 μm. Roughly speaking, as shown in FIG. 3, $\Delta\lambda_b$ tended to shift in the minus direction with increasing interval d and width w. For example, $\Delta\lambda_b$ was about −9 nm when the width w was 5 μm and the interval d was 10 μm.

The above value of $\Delta\lambda_b$, about −9 nm, is equivalent to an increase in bandgap energy of about 80 meV. This amount of change in bandgap energy is sufficient to form an edge window structure.

The symbol $\Delta\lambda_c$ for the vertical axis of the graph shown in FIG. 4 is defined as follows. The wavelength corresponding to the perk energy of the light emitted from the center of a portion, grown between the $SiO_2$ film masks 2, of the active layer 3c in the GaN-based semiconductor layer 3 is referred to as $\lambda_2$ (see FIG. 2A), where $\Delta\lambda_c$ is defined as follows: $\Delta\lambda_c = \lambda_2 - \lambda_1$.

FIG. 4 shows variations in $\Delta\lambda_c$ for varying intervals d between the $SiO_2$ film masks 2 with the width w fixed. The width w was changed between three levels, namely, 5 μm, 30 μm, and 50 μm.

As shown in FIG. 4, $\Delta\lambda_c$ tended to shift in the minus direction when the width w was 30 μm or more. With the width w being 5 μm, $\Delta\lambda_c$ tended to shift in the plus direction when the interval d was 5 μm or less and tended to shift in the minus direction when the interval d was 10 to 50 μm. For example, $\Delta\lambda_c$ was about +5 nm when the width w was 5 μm and the interval d was 3 μm and was about −5 nm when the width w was 5 μm and the interval d was 20 μm.

The data in FIG. 3 shows that it is possible to decrease the emission wavelength (increase the bandgap energy of the active layer 3c) even with a single $SiO_2$ film mask 2.

In addition, surprisingly, FIG. 4 shows that it is possible to meet $\Delta\lambda_c > 0$, that is, to increase the emission wavelength (decrease the bandgap energy of the active layer 3c).

Thus, the bandgap energy of the active layer 3c can be freely changed by appropriately designing the pattern of the $SiO_2$ film masks 2.

The inventors investigated the reason why the bandgap energy of the active layer 3c can be changed at a particular position of the GaN-based semiconductor layer 3 epitaxially grown using the $SiO_2$ film masks 2 as described above. As a result, the inventors concluded that the change in the bandgap energy of the active layer 3c at a particular position of the GaN-based semiconductor layer 3 is attributable to the fact that the diffusion distance of indium is significantly smaller than that of gallium.

This will be described below.

The case where the active layer 3c of the GaN-based semiconductor layer 3 is grown in the regions not covered by the $SiO_2$ film masks 2 on the n-type GaN substrate 1, as shown in FIGS. 2A and 2B, will be discussed. In this case, indium and gallium are supplied to those regions not only directly from source materials, but also through diffusion of indium and gallium supplied onto the $SiO_2$ film masks 2 across the $SiO_2$ film masks 2.

FIGS. 5A and 5B show variations in the concentrations of gallium and indium, respectively, diffused outward from the edges of the $SiO_2$ film masks 2 formed on the n-type GaN substrate 1 against the distance measured from the edges in a direction perpendicular to the $SiO_2$ film masks 2, and FIG. 5C shows variations in the indium content of the active layer 3c.

As shown in FIG. 5A and 5B, because the diffusion distance of indium is significantly smaller than that of gallium, the indium concentration becomes constant at a shorter distance $\Delta X1$, whereas the gallium concentration becomes constant at a longer distance $\Delta X2$.

Accordingly, as shown in FIG. 5C, the indium content of the active layer 3c decreases to the minimum value at the distance $\Delta X1$ and then increases and becomes constant at the distance $\Delta X2$. The distances $\Delta X1$ and $\Delta X2$ increase with increasing concentrations of diffused gallium and indium, respectively.

Figure 6:
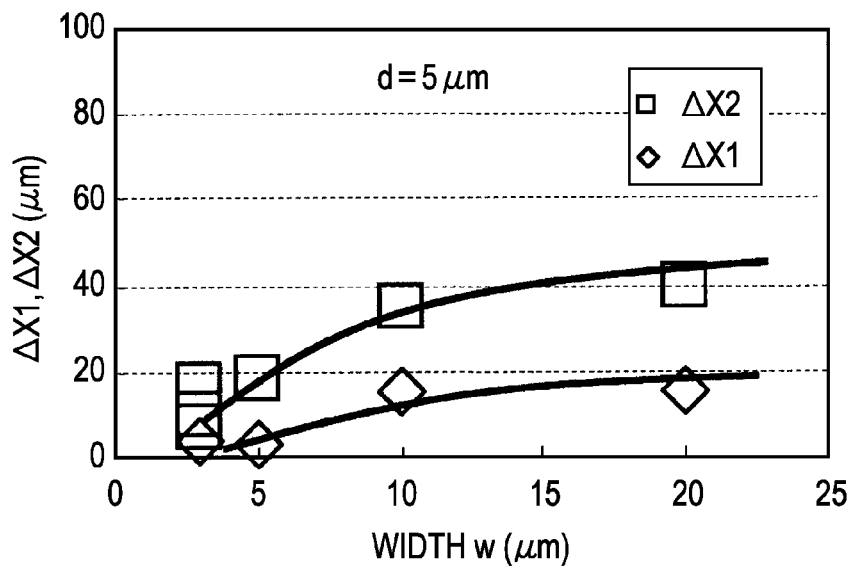
FIG. 6 is a graph showing variations in $\Delta X1$ and $\Delta X2$ for varying widths of the $SiO_2$ film masks on the samples used for the basic research conducted by the inventors with the interval therebetween fixed.
Figure 7:
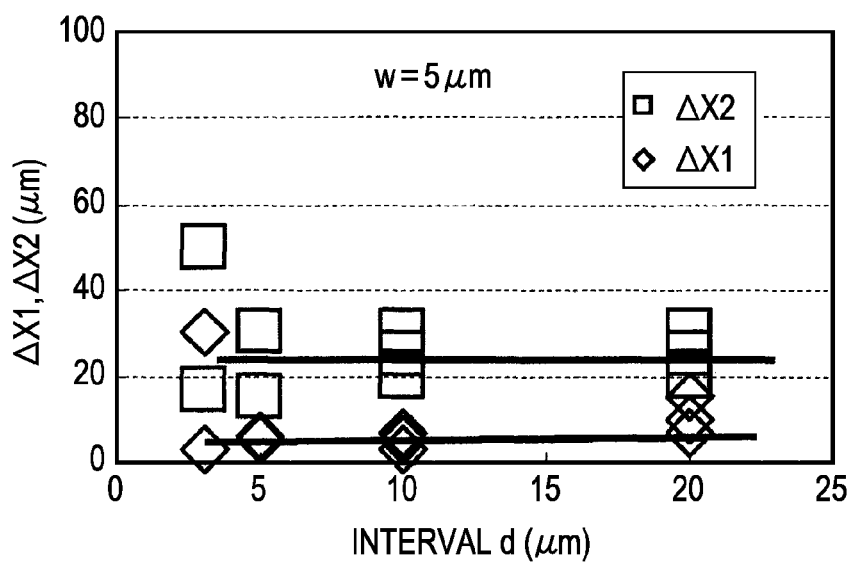
FIG. 7 is a graph showing variations in $\Delta X1$ and $\Delta X2$ for varying intervals between the $SiO_2$ film masks on the samples used for the basic research conducted by the inventors with the width thereof fixed.

FIG. 6 shows the results of measurement of variations in $\Delta X1$ and $\Delta X2$ depending on the width w of the $SiO_2$ film masks 2 with the interval d fixed at 5 μm. FIG. 7, on the other hand, shows the results of measurement of variations in $\Delta X1$ and $\Delta X2$ depending on the interval d between the $SiO_2$ film masks 2 with the width w fixed at 5 μm.

According to FIGS. 6 and 7, the maximum diffusion distance of gallium was about 20 μm at the growth temperature of the active layer 3c when the width w was 3 to 5 μm, whereas the maximum diffusion distance of indium was only about 3 μm, about one order of magnitude smaller than that of gallium.

This suggests that, if the width w is 3 to 5 μm, the indium content of the center of the portion of the active layer 3c between the $SiO_2$ film masks 2 can be decreased, and accordingly the bandgap energy can be increased, even if the interval d is increased to about 40 μm.

Although the case where the $SiO_2$ film masks 2 are used has been described above, the indium content, and therefore the bandgap energy, of the active layer 3c can be similarly controlled using masks formed of other insulating films such as SiN films or $Al_2O_3$ films. The width, interval, shape, position, and so on of the masks are appropriately determined on the basis of, for example, the above findings obtained by the inventors depending on, for example, the desired characteristics of the semiconductor laser.

Examples of mask shapes will be shown. For example, a mask may be formed on a nitride-based III-V compound semiconductor substrate on one side of a position where a laser stripe is to be formed along the position where the laser stripe is to be formed such that the interval between the position where the laser stripe is to be formed and the mask is smaller or larger near a position where an edge window structure is to be formed than in other regions. In this case, preferably, the mask is formed on the side of the position where the laser stripe is to be formed opposite the center line of a first region between two adjacent second regions along the position where the laser stripe is to be formed.

Alternatively, a mask may be formed on a nitride-based III-V compound semiconductor substrate on each side of a position where a laser stripe is to be formed along the position where the laser stripe is to be formed such that the interval between the masks on both sides of the position where the laser stripe is to be formed is larger near a position where an edge window structure is to be formed than in other regions.

Alternatively, a mask may be formed on a nitride-based III-V compound semiconductor substrate on one or each side of a position where a laser stripe is to be formed near a position where an edge window structure is to be formed. The planar shape of the mask is, for example, but not limited to, trapezoidal or rectangular.

In general, the mask width, $W_1$, is smaller than the mask interval, $W_2$, although they are not limited. In general, additionally, if a mask is formed on each side of a position where a laser stripe is to be formed, the relationship between the mask width, $W_3$, and the mask interval, $W_4$, near the center in a resonator length direction satisfies $W_3 < W_4$, and the relationship between the mask width, $W_5$, and the mask interval, $W_6$, near a position where an edge window structure is to be formed satisfies $W_5 < W_6$, although they are not limited.

The use of such masks in the growth of a nitride-based III-V compound semiconductor layer including an active layer enables the following.

The relationship between the indium content, x (or emission wavelength, λ), of the active layer in a portion of the laser stripe between or near the masks and the indium content, y (or emission wavelength, λ'), of the active layer in a portion of the laser stripe that is not near the masks can be controlled so as to satisfy x<y (λ<λ'). In addition, the relationship between the thickness, $t_1$, of the portion of the laser stripe between the masks and the thickness, $t_2$, of the portion of the laser stripe that is not near the masks can be controlled so as to satisfy $t_2 < t_1$.

2. First Embodiment

Semiconductor Laser and Method for Producing Semiconductor Laser

FIG. 8 shows an n-type GaN substrate used as a substrate in a method for producing a GaN-based semiconductor laser according to the first embodiment. The details of the n-type GaN substrate and a method for producing the substrate are disclosed in Patent Document 12.

As shown in FIG. 8, an n-type GaN substrate 11 includes first regions 11a formed of single-crystal GaN and second regions 11b formed of GaN and periodically arranged in parallel between the first regions 11a so as to extend linearly in a striped pattern.

The second regions 11b are formed of polycrystals, single crystals slightly inclined with respect to those of the first regions 11a, or single crystals inverted along the c-axis with respect to those of the first regions 11a. The first regions 11a have a first average dislocation density, whereas the second regions 11b have a second average dislocation density higher than the first average dislocation density. The second regions 11b extend through the n-type GaN substrate 11.

The average dislocation density of the second regions 11b is generally at least five times that of the first regions 11a. Typically, the average dislocation density of the first regions 11a is $2\times10^6$ cm$^{-2}$ or less, whereas the average dislocation density of the second regions 11b is $1\times10^8$ cm$^{-2}$ or more. The width of the second regions 11b is generally 10 to 100 µm, typically 20 to 50 µm, although it is not limited.

Third regions may occur as transition regions between the first regions 11a and the second regions 11b. The average dislocation density of the third regions is typically less than $1\times10^8$ cm$^{-2}$ and more than $2\times10^6$ cm$^{-2}$.

The n-type GaN substrate 11 is (0001)-oriented (c-plane-oriented) in this embodiment, although it may be differently oriented, for example, r-plane-oriented, a-plane-oriented, or m-plane-oriented. In this case, the longitudinal direction of the second regions 11b is typically, but not limited to, a direction parallel to the <1-100> or <11-20> direction of the n-type GaN substrate 11. The thickness of the n-type GaN substrate 11 is appropriately selected and is generally, for example, 200 to 600 µm.

FIGS. 9 to 13 illustrate the method for producing the GaN-based semiconductor laser according to the first embodiment. This GaN-based semiconductor laser has an edge window structure and a ridge stripe structure and includes non-current-injected regions formed at both ends of a resonator by removing portions of a p-side electrode near the edges of the resonator.

Figure 10A:
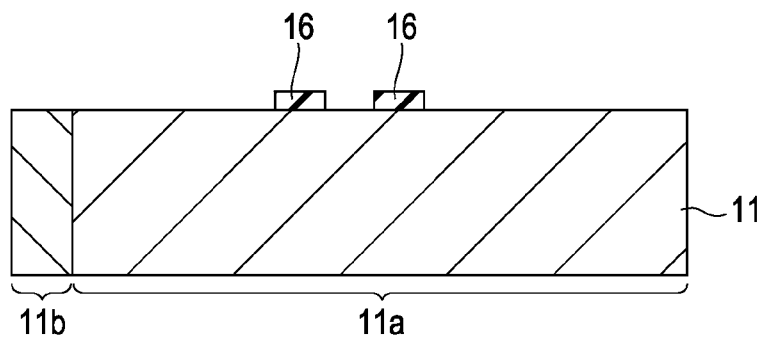
FIGS. 10A and 10B are sectional views showing the method for producing a GaN-based semiconductor laser according to the first embodiment of the present invention.
Figure 10B:
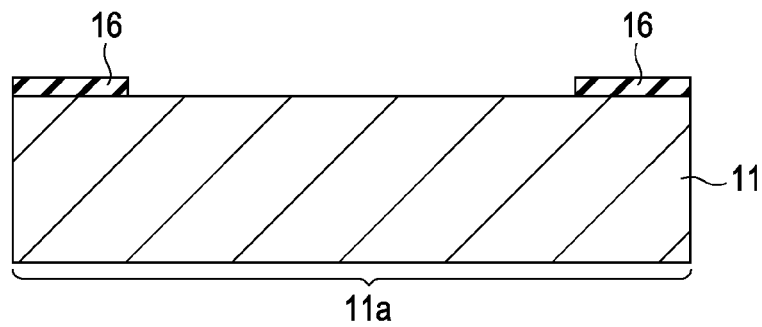

In this embodiment, first, as shown in FIGS. 9, 10A, and 10B, chip regions 12 are defined on the n-type GaN substrate 11, each finally forming one laser chip. FIG. 9 is a plan view, FIG. 10A is a sectional view taken along line XA-XA in FIG. 9, and FIG. 10B is a sectional view taken along line XB-XB in FIG. 9.

The arrangement period of the second regions 11b (the distance between the center lines of each two adjacent second regions 11b) is twice the width of the chip regions 12 in a direction perpendicular to the resonator length direction. Two chip regions 12, corresponding to two laser chips, are defined between the center lines of each two adjacent second regions 11b.

In each chip region 12, insulating film masks 16 are formed on both sides of a ridge-stripe forming position 15 where a ridge stripe is to be formed near resonator-edge forming positions 13 and 14 where front and rear edges of a resonator are to be finally formed by, for example, cleavage. The ridge-stripe forming positions 15 in each two adjacent chip regions 12 are symmetrical with respect to the center line of the first region 11a between the two adjacent second regions 11b.

Accordingly, the distances between the ridge-stripe forming positions 15 and the second regions 11b in the two chip regions 12 are equal. Ridge stripes are finally formed on the center lines of the ridge-stripe forming positions 15 but are narrower than the ridge-stripe forming positions 15.

The planar shape of the insulating film masks 16 is trapezoidal. The insulating film masks 16 are symmetrical with respect to the ridge-stripe forming positions 15 and are symmetrical with respect to the center line of the first region 11a between the two adjacent second regions 11b.

The ridge-stripe forming positions 15 may be located near the center lines of the chip regions 12 in the resonator length direction; in this embodiment, they are located closer to the center line of the first region 11a between the two adjacent second regions 11b by a predetermined distance. The predetermined distance is appropriately selected and may be, for example, about one third of the distance between the center lines of the two adjacent second regions 11b.

The reason is to separate the ridge-stripe forming positions 15 from the second regions 11b, which have a high average dislocation density, that is, a high defect density, by such a distance that no adverse effect occurs to form ridge stripes on portions of a GaN-based semiconductor layer that have a lower defect density.

Of the pair of parallel sides of each insulating film mask 16, the longer side is located along one edge of the ridge-stripe forming position 15. The insulating film masks 16 have a width $w_1$ within a distance $d_1$ from the resonator-edge forming positions 13 and 14 and are tapered such that the width decreases linearly from $w_1$ to zero within a distance $d_2$ excluding the distance $d_1$ in the resonator length direction. For example, $d_1$ is 20 µm, $d_2$ is 50 µm, and $w_1$ is 5 µm, although they are not limited.

The insulating film masks 16 can be formed of insulating films such as SiO$_2$ films, SiN films, or Al$_2$O$_3$ films. The insulating film masks 16 can be easily formed by, for example, forming an insulating film on the n-type GaN substrate 11 by vacuum deposition or CVD and patterning the insulating film by etching. The thickness of the insulating film masks 16 is, for example, but not limited to, about 300 nm.

The width of the ridge stripes to be formed in the ridge-stripe forming positions 15 is determined by, for example, the desired characteristics of the GaN-based semiconductor laser, and is generally, for example, about 1 to 20 µm (or about 1 to 12 µm), although it is not limited.

The chip regions 12 are actually repeated in two orthogonal directions over the n-type GaN substrate 11, although only two adjacent chip regions 12 are shown in FIG. 9. In addition, the insulating film masks 16 are actually formed so as to overlap two or more chip regions 12 adjacent in the resonator length direction, although only those disposed within the individual chip regions 12 are shown in FIG. 9.

The shape and size of the chip regions 12 shown in FIG. 9 are merely illustrative, and they are not limited.

Figure 11A:
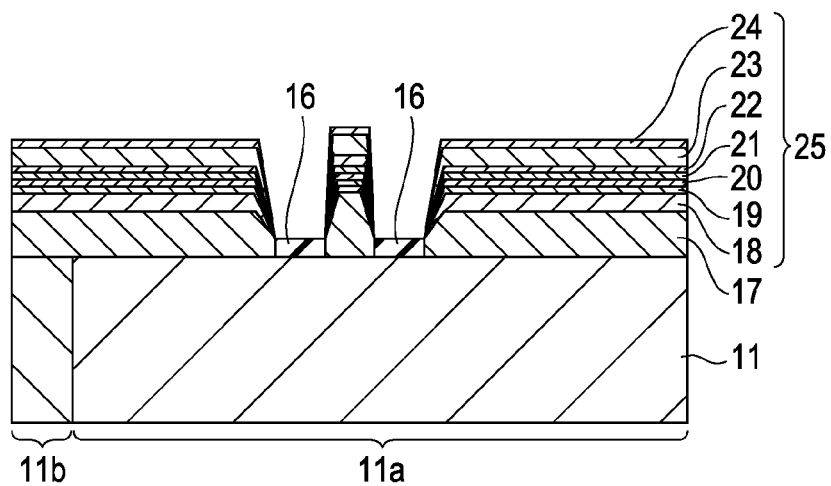
FIGS. 11A and 11B are sectional views showing the method for producing a GaN-based semiconductor laser according to the first embodiment of the present invention.
Figure 11B:
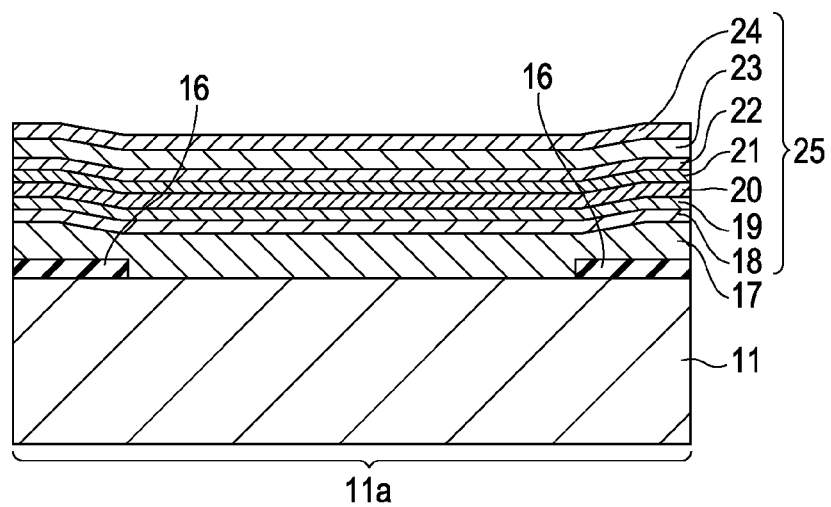

Next, as shown in FIGS. 11A and 11B, a GaN-based semiconductor layer forming a laser structure is epitaxially grown on the n-type GaN substrate 11 with the insulating film masks 16 by, for example, metal-organic chemical vapor deposition (MOCVD). FIG. 11A is a sectional view taken along line XA-XA in FIG. 9, and FIG. 11B is a sectional view taken along line XB-XB in FIG. 9.

Specifically, the GaN-based semiconductor layer forming a laser structure is formed by epitaxially growing an n-type AlGaN cladding layer 17, an n-type GaN waveguide layer 18, an active layer 19, an undoped InGaN waveguide layer 20, an undoped AlGaN waveguide layer 21, a p-type AlGaN electron barrier layer 22, a p-type GaN/undoped AlGaN superlattice cladding layer 23, and a p-type GaN contact layer 24 in the above order.

The active layer 19 is, for example, but not limited to, a layer with an undoped Ga$_{1-x}$In$_x$N (quantum well layer)/Ga$_{1-y}$In$_y$N (barrier layer) multiple quantum well structure (where x>y).

The layers containing no indium, namely, the n-type AlGaN cladding layer 17, the n-type GaN waveguide layer 18, the undoped AlGaN waveguide layer 21, the p-type AlGaN electron barrier layer 22, the p-type GaN/undoped AlGaN superlattice cladding layer 23, and the p-type GaN contact layer 24, are grown at, for example, about 900° C. to 1100° C.

The layers containing indium, namely, the active layer 19 with a Ga$_{1-x}$In$_x$N/Ga$_{1-y}$In$_y$N multiple quantum well structure and the undoped InGaN waveguide layer 20, are grown at, for example, about 700° C. to 800° C.

The above layers forming a laser structure will be hereinafter collectively referred to as a GaN-based semiconductor layer 25.

Examples of the source materials used for growth of the GaN-based semiconductor layer 25 will be shown below, although they are not limited.

The source material of gallium is, for example, triethylgallium (($C_2H_5)_3$Ga, TEG) or trimethylgallium (($CH_3)_3$Ga, TMG).

The source material of aluminum is, for example, trimethylaluminum (($CH_3)_3$Al, TMA).

The source material of indium is, for example, triethylindium (($C_2H_5)_3$In, TEI) or trimethylindium (($CH_3)_3$In, TMI).

The source material of nitrogen is, for example, ammonia ($NH_3$).

The n-type dopant used is, for example, monosilane ($SiH_4$). The p-type dopant used is, for example, bis(methylcyclopentadienyl)magnesium (($CH_3C_5H_4)_2$Mg), bis(ethylcyclopentadienyl)magnesium (($C_2H_5C_5H_4)_2$Mg), or bis(cyclopentadienyl)magnesium (($C_5H_5)_2$Mg).

The carrier gas used during the growth of the GaN-based semiconductor layer 25 is, for example, but not limited to, hydrogen gas.

The ratio of the flow rate of the source materials of the Group V elements to that of the source materials of the Group III elements (V/III ratio) is generally, but not limited to, $10^3$ to $10^6$ (for example, about $10^5$).

The pressure during the growth is, for example, but not limited to, 760 Torr (atmospheric pressure).

The n-type AlGaN cladding layer 17, the n-type GaN waveguide layer 18, the active layer 19, the undoped InGaN waveguide layer 20, the undoped AlGaN waveguide layer 21, the p-type AlGaN electron barrier layer 22, the p-type GaN/undoped AlGaN superlattice cladding layer 23, and the p-type GaN contact layer 24 do not substantially grow on the insulating film masks 16, but only in a region not covered by the insulating film masks 16 on the n-type GaN substrate 11. Such growth can be easily achieved by a common method under selected growth conditions.

In the growth of the n-type AlGaN cladding layer 17, the thickness of the n-type AlGaN cladding layer 17 is larger between each pair of insulating film masks 16 than in other regions for the following reason.

Aluminum and gallium atoms are directly supplied from the source materials to the ridge-stripe forming position 15 between each pair of insulating film masks 16. In addition, aluminum and gallium atoms supplied from the source materials onto the insulating film masks 16 on both sides of the ridge-stripe forming position 15 are supplied to the ridge-stripe forming position 15 through diffusion over the insulating film masks 16, thus contributing to the growth.

As a result, the thickness of the n-type AlGaN cladding layer 17 is larger between each pair of insulating film masks 16 than in other regions. The width of the insulating film masks 16 within the distance $d_2$ excluding the distance $d_1$ from the resonator-edge forming positions 13 and 14 decreases linearly and gradually from $w_1$ to zero. Hence, the number of aluminum and gallium atoms supplied from the insulating film masks 16 to the ridge-stripe forming position 15 within the distance $d_2$ excluding the distance $d_1$ decreases gradually in the resonator length direction. Accordingly, the thickness of the n-type AlGaN cladding layer 17 increases gradually toward the resonator-edge forming positions 13 and 14 in the resonator length direction within the distance $d_2$ excluding the distance $d_1$.

The insulating film masks 16, on the other hand, have the constant width $w_1$ within the distance $d_1$ from the resonator-edge forming positions 13 and 14. Hence, the number of aluminum and gallium atoms supplied from the insulating film masks 16 to the ridge-stripe forming position 15 within the distance $d_1$ remains constant in the resonator length direction. Accordingly, the thickness of the n-type AlGaN cladding layer 17 remains constant within the distance $d_1$. This also applies to the n-type GaN waveguide layer 18.

In the growth of the active layer 19, which contains indium and gallium, indium and gallium atoms are directly supplied from the source materials to the ridge-stripe forming position 15 between each pair of insulating film masks 16. In addition, indium and gallium atoms supplied from the source materials onto the insulating film masks 16 on both sides of the ridge-stripe forming position 15 are supplied to the ridge-stripe forming position 15 through diffusion, thus contributing to the growth.

Because the diffusion distance of indium atoms is about one order of magnitude smaller than that of gallium atoms at the growth temperature of the active layer 19 (for example, 700° C. to 800° C.), the number of indium atoms supplied from the insulating film masks 16 to the ridge-stripe forming position 15 is smaller than that of gallium atoms. As a result, the indium content of the active layer 19 varies in the resonator length direction, being lower between each pair of insulating film masks 16 than in other regions.

Accordingly, the bandgap energy is larger between each pair of insulating film masks 16 that in other regions, so that this region serves as an edge window structure. The growth of the undoped InGaN waveguide layer 20 is similar to that of the active layer 19.

The growth of the undoped AlGaN waveguide layer 21, the p-type AlGaN electron barrier layer 22, the p-type GaN/undoped AlGaN superlattice cladding layer 23, and the p-type GaN contact layer 24 are similar to that of the n-type AlGaN cladding layer 17 and the n-type GaN waveguide layer 18.

Next, according to a method disclosed in Japanese Unexamined Patent Application Publication No. 2008-34587 (Patent Document 13) for producing a semiconductor laser with an edge non-current-injected structure, ridge stripes are formed in the ridge-stripe forming positions 15 at the top of the GaN-based semiconductor layer 25, and p-side electrodes are formed thereon. In addition, isolation electrodes and pad electrodes are formed separately for the individual chip regions 12, and n-side electrodes are formed on the backside of the n-type GaN substrate 11 separately for the individual chip regions 12.

Next, the n-type GaN substrate 11 with the above laser structure is cut along the resonator-edge forming positions 13 and 14 into laser bars by, for example, cleavage, thus forming edges of resonators. The laser bars are processed into chips by, for example, coating the edges of the resonators and cleaving the laser bars.

Thus, a desired GaN-based semiconductor laser is produced.

Figure 12A:
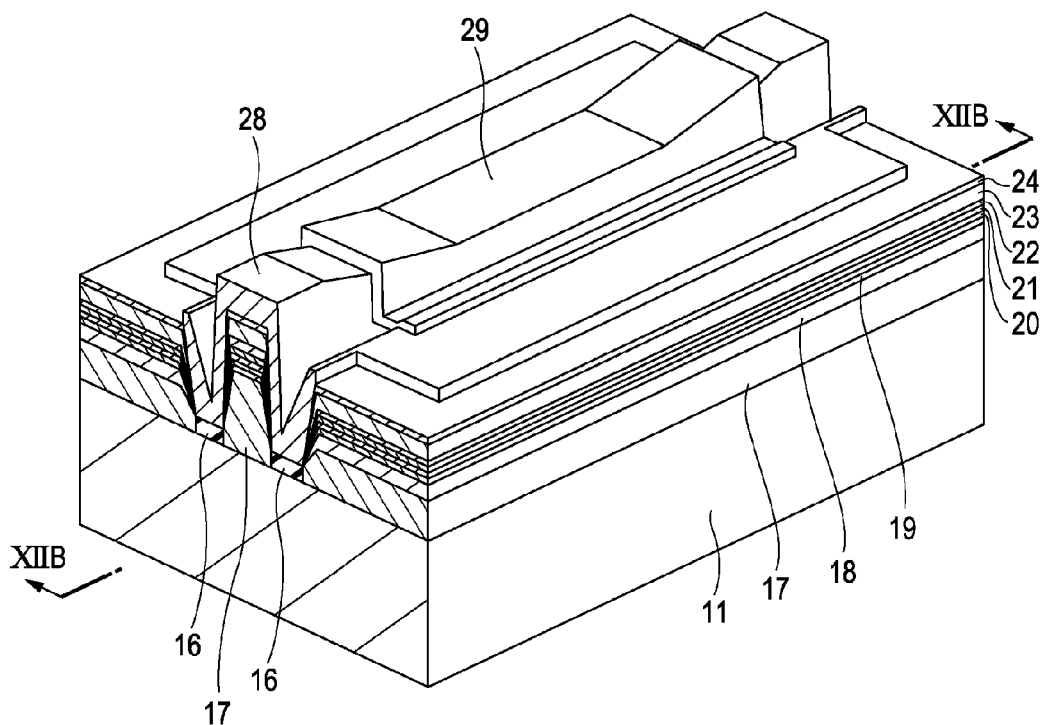
FIGS. 12A and 12B are a perspective view and a sectional view, respectively, showing the structure of a GaN-based semiconductor laser produced according to the first embodiment of the present invention.
Figure 12B:
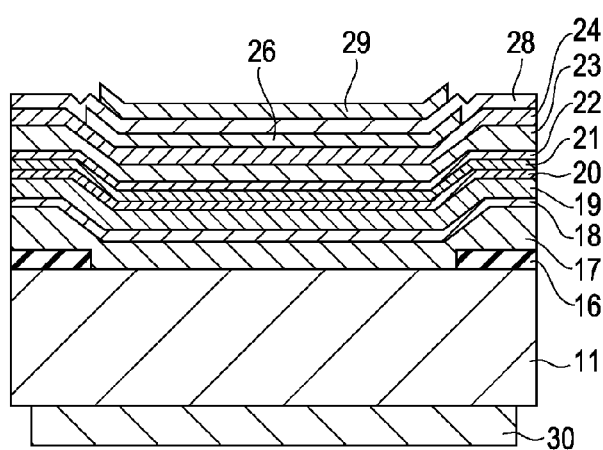
Figure 13:
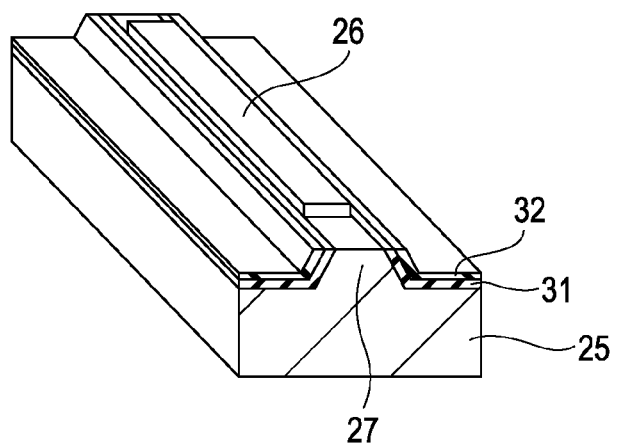
FIG. 13 is a perspective view showing a ridge stripe and a p-side electrode, formed thereon, of the GaN-based semiconductor laser produced according to the first embodiment of the present invention.

FIGS. 12A and 12B show the detailed structure of the GaN-based semiconductor laser thus produced. FIG. 12A is a perspective view, and FIG. 12B is a sectional view taken along line XIIB-XIIB in FIG. 12A. FIG. 13 shows a ridge stripe and a p-side electrode formed thereon in enlarged view.

In FIGS. 12A, 12B, and 13, reference numeral 26 denotes the p-side electrode, reference numeral 27 denotes the ridge stripe, reference numeral 28 denotes the isolation electrode, reference numeral 29 denotes the pad electrode, and reference numeral 30 denotes the n-side electrode. The p-side electrode 26 includes, for example, a palladium film and a platinum film formed thereon.

The ridge stripe 27 is formed in, for example, an upper portion of the p-type GaN/undoped AlGaN superlattice cladding layer 23 and the p-type GaN contact layer 24. The height of the ridge stripe 27 is, for example, but not limited to, 0.4 to 0.65 μm.

As shown in FIG. 13, for example, insulating films 31, such as $SiO_2$ films, and insulating films 32, such as undoped silicon films, are formed on both sides of the ridge stripe 27 so as to extend outward therefrom.

The isolation electrode 28 includes, for example, titanium, platinum, and nickel films. For example, the bottommost titanium film has a thickness of 10 nm, the platinum film has a thickness of 100 nm, and the topmost nickel film has a thickness of 100 nm, although they are not limited.

The pad electrode 29 includes, for example, titanium, platinum, and gold films. For example, the bottommost titanium film has a thickness of 10 nm, the platinum film has a thickness of 100 nm, and the topmost gold film has a thickness of 300 nm, although they are not limited.

In the GaN-based semiconductor laser, the chip of the n-type GaN substrate 11 includes a first region 11a and a second region 11b disposed along one side of the chip parallel to the resonator length direction (see FIG. 9).

The first embodiment provides the following various advantages.

The bandgap energy of the active layer 19 can be made larger near the resonator-edge forming positions 13 and 14 than in other regions simply by forming the insulating film masks 16 on the n-type GaN substrate 11 in advance and growing the GaN-based semiconductor layer 25 forming a laser structure thereon. This allows an edge window structure to be easily formed.

Figure 25:
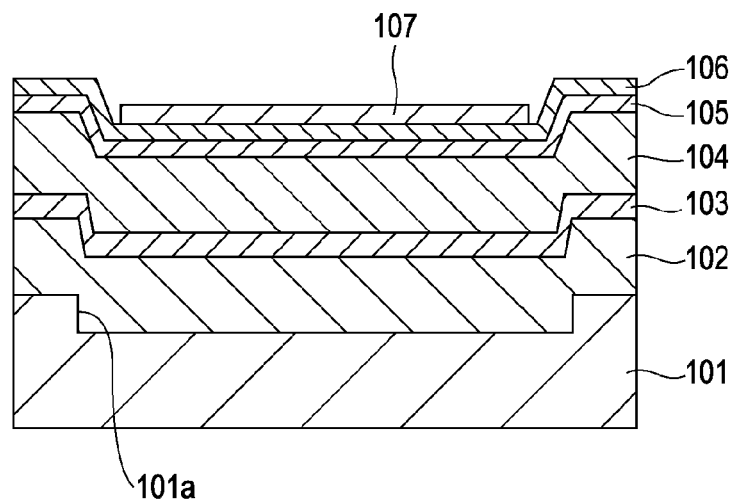
FIG. 25 is a sectional view of a GaN-based semiconductor laser produced by a method for forming an edge window structure in the related art.

In addition, the GaN-based semiconductor layer 25 has no steep step because the thickness of the GaN-based semiconductor layer 25 between each pair of insulating film masks 16 increases gradually toward the resonator-edge forming positions 13 and 14 in the resonator length direction. The GaN-based semiconductor laser according to this embodiment therefore causes significantly low waveguide loss, unlike the semiconductor laser of the related art in FIG. 25, in which the semiconductor layer forming a laser structure has steep geometrical steps between the recess 101a and the outer region.

In addition, no surface level appears when an edge window structure is formed because the edge window structure can be formed without etching the semiconductor layer 25 forming a laser structure by RIE. This avoids the problem of light absorption and local heat generation due to a surface level during laser operation.

In addition, a larger number of GaN-based semiconductor lasers can be produced from the single n-type GaN substrate 11 because two chip regions 12 are defined between each two adjacent second regions 11b of the n-type GaN substrate 11. This reduces the production costs of GaN-based semiconductor lasers.

In this embodiment, additionally, a GaN-based semiconductor laser can be easily produced in which the ridge stripe 27 is formed so as to be self-aligned to the p-side electrode 26 and in which non-electron-injected regions are formed at both edges of the resonator by removing portions of the p-side electrode 26 near the edges of the resonator (see Patent Document 13).

Because the GaN-based semiconductor laser has the non-electron-injected regions at the edges of the resonator, it is possible to effectively prevent catastrophic optical damage (COD) at the edges of the resonator, thus attaining extended lifetime and improved reliability.

The GaN-based semiconductor laser is suitable for use as, for example, a light source for an optical pickup of an optical disk drive. The optical disk drive may be playback-only (read-only), record-only (write-only), or capable of both playback and recording and may operate in any playback and/or recording mode.

3. Second Embodiment

Semiconductor Laser and Method for Producing Semiconductor Laser

The second embodiment differs from the first embodiment in the shape and positions of the insulating film masks 16. In other respects, the second embodiment is similar to the first embodiment.

Figure 14:
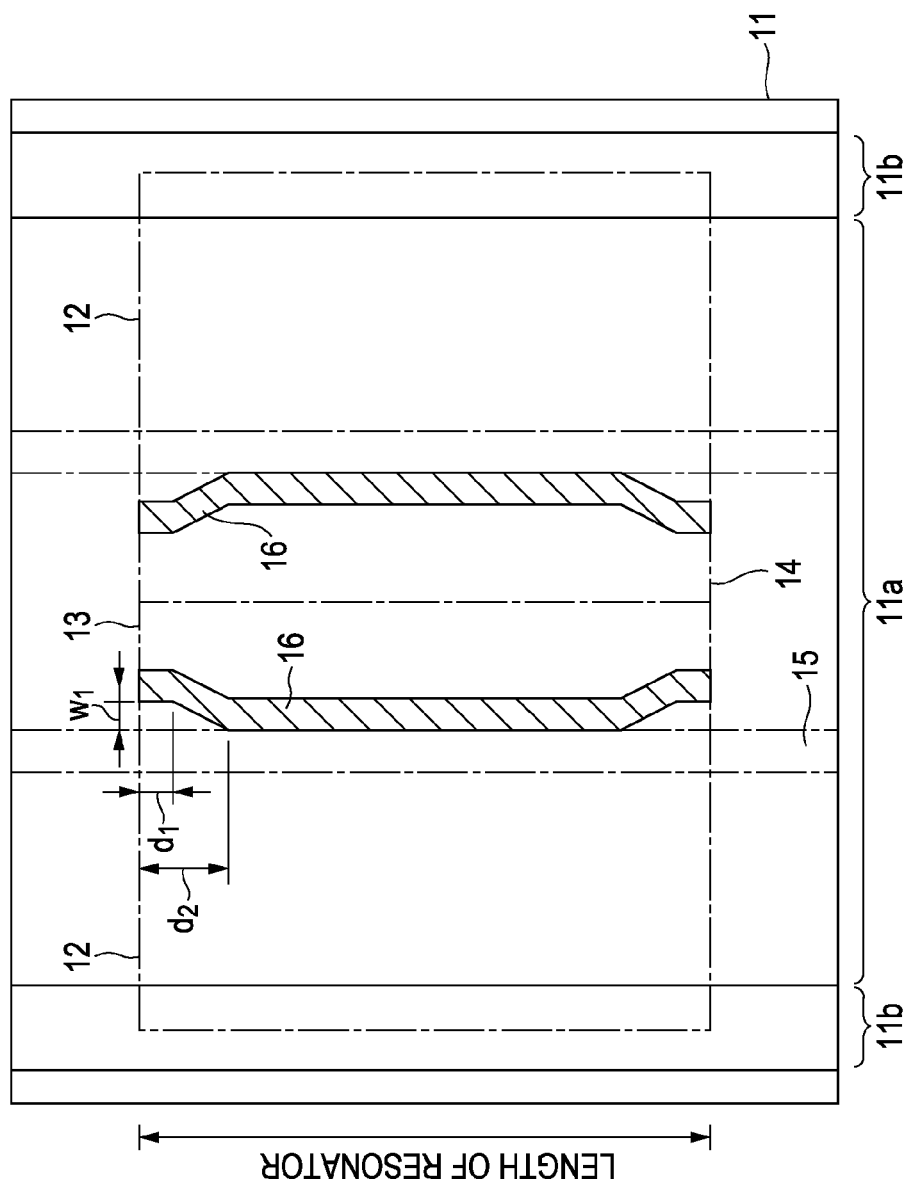
FIG. 14 is a plan view showing a method for producing a GaN-based semiconductor laser according to a second embodiment of the present invention.

In the second embodiment, first, as shown in FIG. 14, an elongated insulating film mask 16 with a constant width is formed on one side of each ridge-stripe forming position 15 on the n-type GaN substrate 11, specifically, on the side opposite the center line of the first region 11a between each two adjacent second regions 11b, over the length of the resonator.

An edge of the insulating film mask 16 opposite the ridge-stripe forming position 15 agrees with an edge of the ridge-stripe forming position 15 in the center in the resonator length direction and is separated from the ridge-stripe forming position 15 at an interval $w_1$ over the distance $d_1$ from the resonator-edge forming positions 13 and 14, and the interval decreases gradually from $w_1$ to zero over the distance $d_2$ excluding the distance $d_1$. For example, $d_1$ is 20 μm, $d_2$ is 50 μm, the width of the insulating film mask 16 is 5 μm, and $w_1$ is 5 to 10 μm, although they are not limited.

Next, as in the first embodiment, the GaN-based semiconductor layer 25 forming a laser structure is grown on the n-type GaN substrate 11 with the insulating film masks 16 by, for example, MOCVD. For the active layer 19, which contains indium and gallium, the distance from the edge of the insulating film mask 16 to the ridge-stripe forming position 15 is larger over the distance $d_2$ from the resonator-edge forming positions 13 and 14 than in the center in the resonator length direction.

Because the diffusion distance of indium atoms is about one order of magnitude smaller than that of gallium atoms, the number of indium atoms supplied from the insulating film masks 16 to the ridge-stripe forming position 15 is smaller than that of gallium atoms. As a result, the indium content of the active layer 19 varies in the resonator length direction, being lower near the resonator-edge forming positions 13 and 14 than in other regions. Accordingly, the bandgap energy is larger near the resonator-edge forming positions 13 and 14 than in other regions. Thus, the regions of the active layer 19 with the larger bandgap energy serve as an edge window structure.

Afterwards, a desired GaN-based semiconductor laser is produced through the remaining process as in the first embodiment.

The second embodiment provides advantages similar to those of the first embodiment.

4. Third Embodiment

Semiconductor Laser and Method for Producing Semiconductor Laser

The third embodiment differs from the first and second embodiments in the shape and positions of the insulating film masks 16. In other respects, the third embodiment is similar to the first embodiment.

Figure 15:
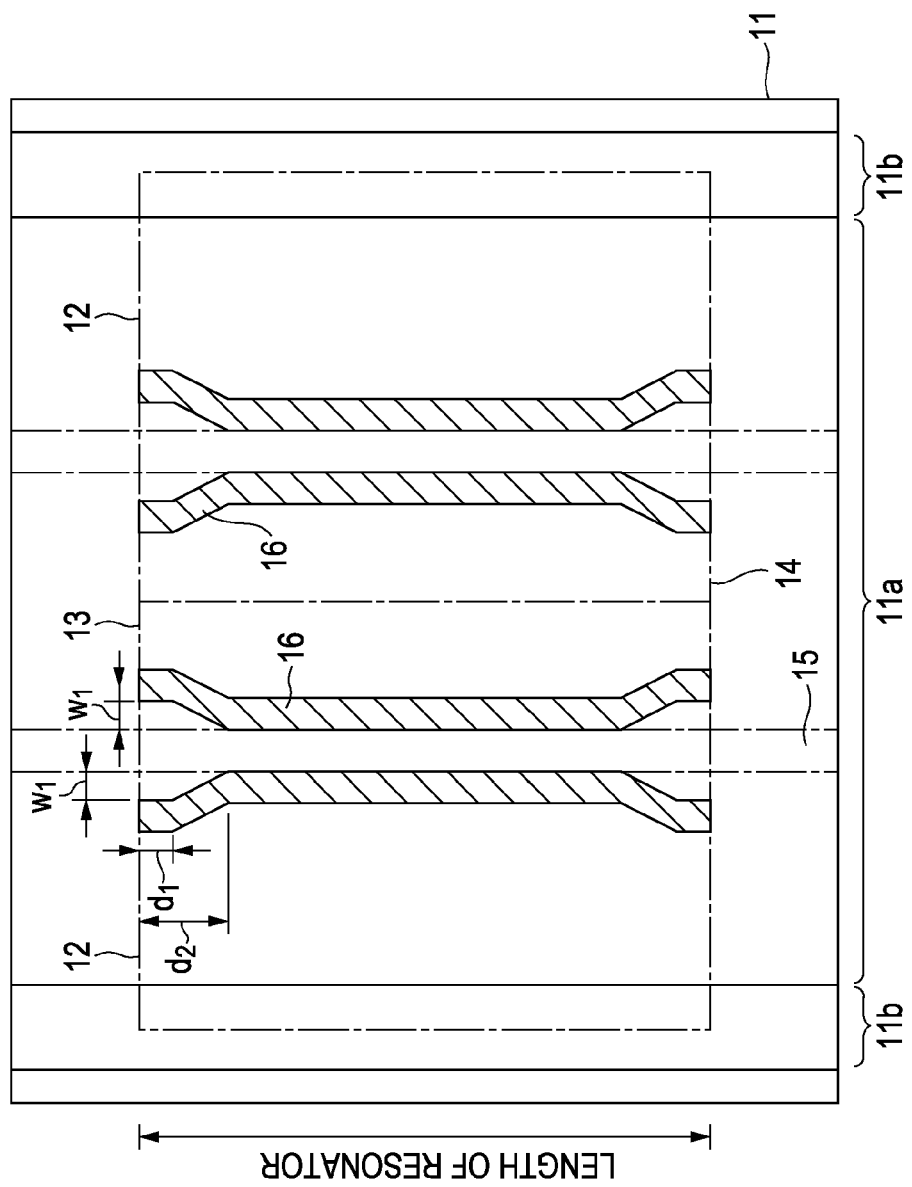
FIG. 15 is a plan view showing a method for producing a GaN-based semiconductor laser according to a third embodiment of the present invention.

In the third embodiment, first, as shown in FIG. 15, the insulating film masks 16 used in the second embodiment are symmetrically formed on both sides of each ridge-stripe forming position 15 on the n-type GaN substrate 11. For example, $d_1$ is 20 μm, $d_2$ is 50 μm, the width of the insulating film masks 16 is 5 μm, and the interval $w_1$ between the insulating masks 16 and the ridge-stripe forming position 15 is 3 to 20 μm, although they are not limited.

Next, as in the first embodiment, the GaN-based semiconductor layer 25 forming a laser structure is grown on the n-type GaN substrate 11 with the insulating film masks 16 by, for example, MOCVD. For the active layer 19, which contains indium and gallium, the interval between each pair of insulating film masks 16 and the distance from the edges of the insulating film masks 16 to the ridge-stripe forming position 15 are larger over the distance $d_2$ from the resonator-edge forming positions 13 and 14 than in the center in the resonator length direction.

Because the diffusion distance of indium atoms is about one order of magnitude smaller than that of gallium atoms, the number of indium atoms supplied from the insulating film masks 16 on both sides of the ridge-stripe forming position 15 to the ridge-stripe forming position 15 is smaller than that of gallium atoms.

As a result, the indium content of the active layer 19 varies in the resonator length direction, being lower between each pair of insulating film masks 16 near the resonator-edge forming positions 13 and 14 than in other regions. Accordingly, the bandgap energy is larger near the resonator-edge forming positions 13 and 14 than in other regions. Thus, the regions of the active layer 19 with the larger bandgap energy serve as an edge window structure.

Afterwards, a desired GaN-based semiconductor laser is produced through the remaining process as in the first embodiment.

The third embodiment provides advantages similar to those of the first embodiment.

5. Fourth Embodiment

Semiconductor Laser and Method for Producing Semiconductor Laser

The fourth embodiment differs from the first to third embodiments in the shape and positions of the insulating film masks 16. In other respects, the fourth embodiment is similar to the first embodiment.

Figure 16:
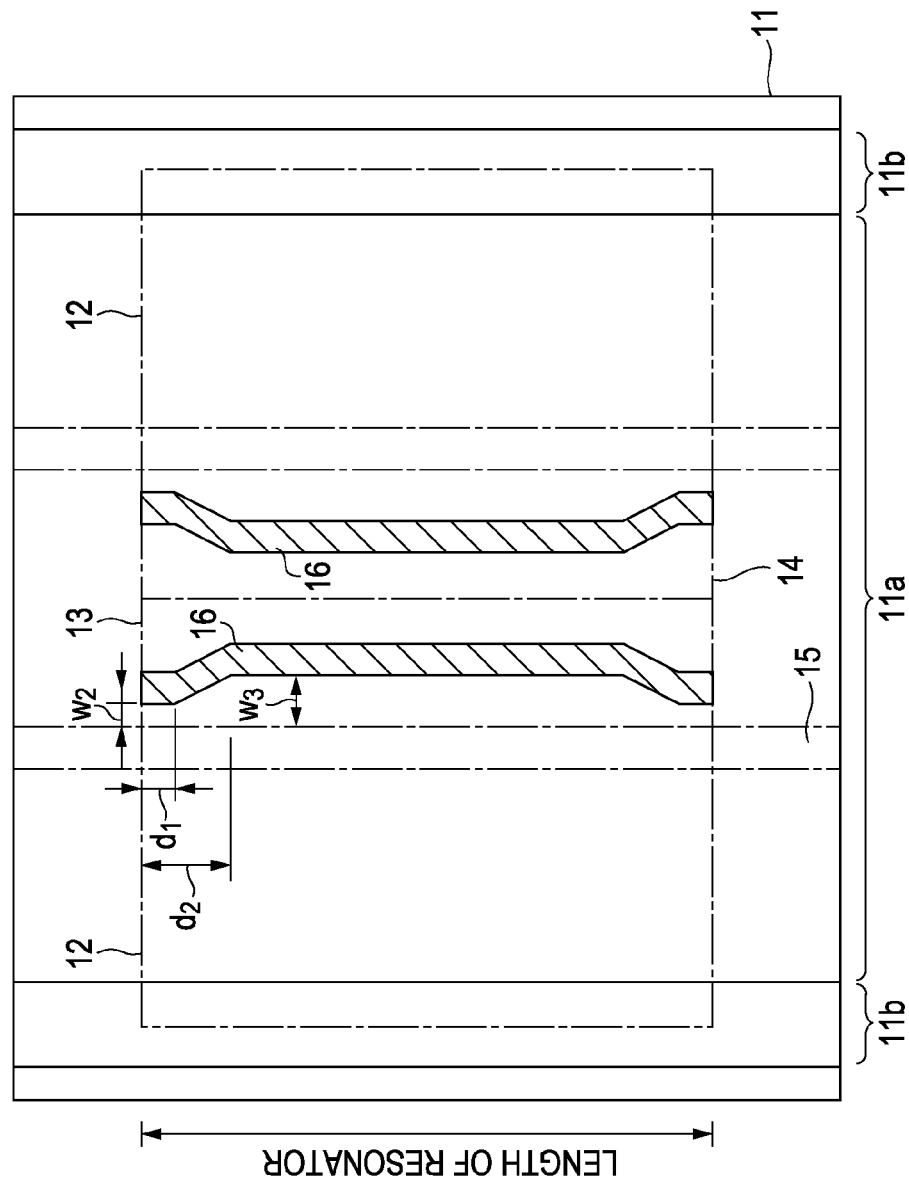
FIG. 16 is a plan view showing a method for producing a GaN-based semiconductor laser according to a fourth embodiment of the present invention.

In the fourth embodiment, first, as shown in FIG. 16, an elongated insulating film mask 16 with a constant width is formed on one side of each ridge-stripe forming position 15 on the n-type GaN substrate 11, specifically, on the side opposite the center line of the first region 11a between each two adjacent second regions 11b, over the length of the resonator.

An edge of the insulating film mask 16 opposite the ridge-stripe forming position 15 is separated from an edge of the ridge-stripe forming position 15 at an interval $w_2$ over the distance $d_1$ from the resonator-edge forming positions 13 and 14 and at an interval $w_3$ in the center in the resonator length direction, and the interval increases linearly and gradually from $w_2$ to $w_3$ over the distance d2 excluding the distance $d_1$.

For example, $w_2$ is nearly equal to ΔX1 in FIG. 5C, whereas $w_3$ is nearly equal to or larger than ΔX2 in FIG. 5C. For example, $d_1$ is 20 μm, $d_2$ is 50 μm, the width of the insulating film mask 16 is 5 μm, $w_2$ is 3 to 5 μm, and $w_3$ is 10 μm, although they are not limited.

Next, as in the first embodiment, the GaN-based semiconductor layer 25 forming a laser structure is grown on the n-type GaN substrate 11 with the insulating film masks 16 by, for example, MOCVD. For the active layer 19, which contains indium and gallium, the distance from the edge of the insulating film mask 16 to the ridge-stripe forming position 15 is nearly equal to ΔX1 in FIG. 5C over the distance $d_1$ from the resonator-edge forming positions 13 and 14.

In the center in the resonator length direction, on the other hand, the distance from the edge of the insulating film mask 16 to the ridge-stripe forming position 15 is nearly equal to or larger than ΔX2 in FIG. 5C. As a result, as shown in FIG. 5C, the indium content is lower near the resonator-edge forming positions 13 and 14 than in other regions. Accordingly, the bandgap energy is larger near the resonator-edge forming positions 13 and 14 than in other regions. Thus, the regions of the active layer 19 with the larger bandgap energy serve as an edge window structure.

Afterwards, a desired GaN-based semiconductor laser is produced through the remaining process as in the first embodiment.

The fourth embodiment provides advantages similar to those of the first embodiment.

6. Fifth Embodiment

Semiconductor Laser and Method for Producing Semiconductor Laser

The fifth embodiment differs from the first to fourth embodiments in the shape and positions of the insulating film masks 16. In other respects, the fifth embodiment is similar to the first embodiment.

Figure 17:
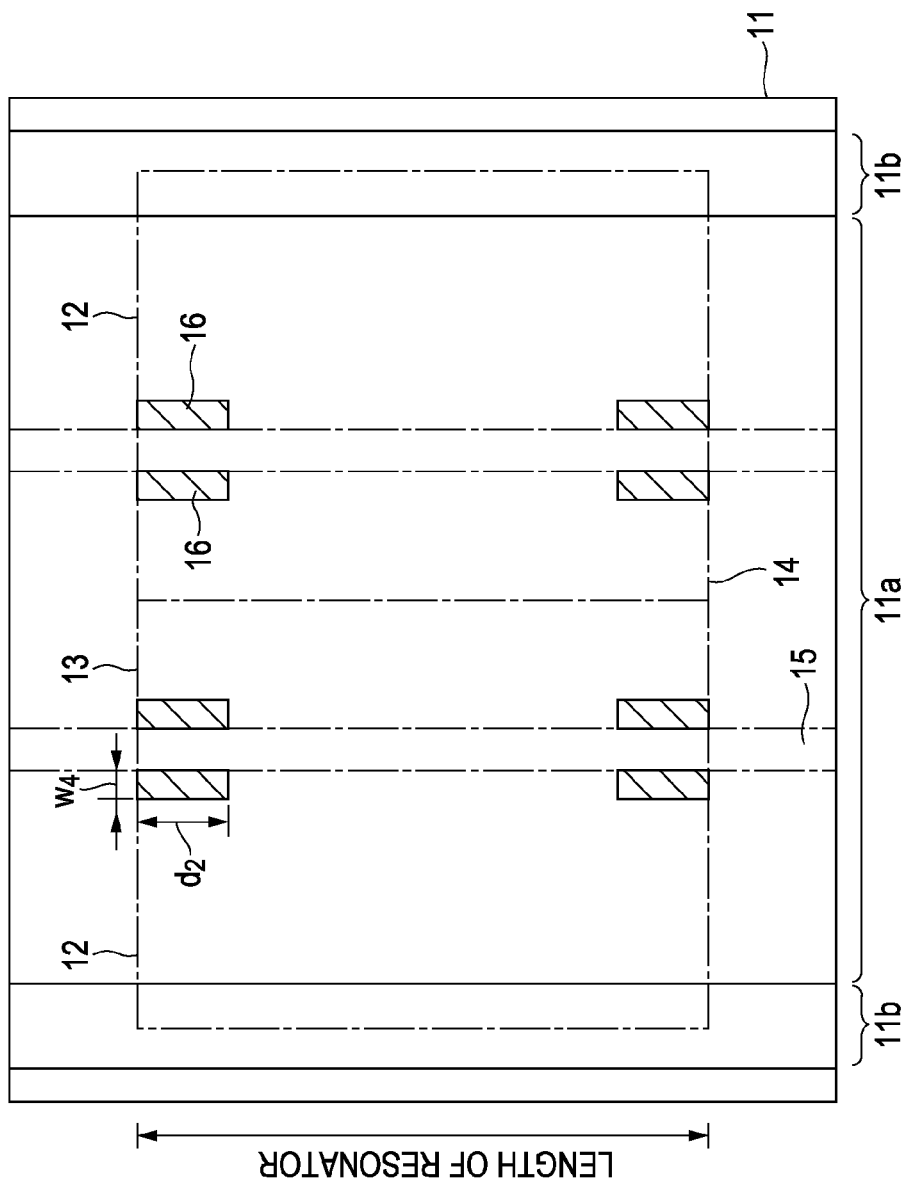
FIG. 17 is a plan view showing a method for producing a GaN-based semiconductor laser according to a fifth embodiment of the present invention.

In the fifth embodiment, first, as shown in FIG. 17, the insulating film masks 16 are formed in a rectangular planar shape on the n-type GaN substrate 11 on both sides of each ridge-stripe forming position 15 near the resonator-edge forming positions 13 and 14.

The insulating film masks 16 are symmetrical with respect to the ridge-stripe forming position 15 and are symmetrical with respect to the center line of the first region 11a between the two adjacent second regions 11b.

An edge of each insulating film mask 16 opposite the ridge-stripe forming position 15 agrees with an edge of the ridge-stripe forming position 15. The insulating film mask 16 has a constant width $w_4$ in the resonator length direction. For example, $d_2$ is 20 to 50 μm, and the width of the insulating film mask 16 is 5 to 10 μm, although they are not limited.

Next, as in the first embodiment, the GaN-based semiconductor layer 25 forming a laser structure is grown on the n-type GaN substrate 11 with the insulating film masks 16 by, for example, MOCVD.

For the active layer 19, which contains indium and gallium, because the diffusion distance of indium atoms is about one order of magnitude smaller than that of gallium atoms, the number of indium atoms supplied from the insulating film masks 16 on both sides of the ridge-stripe forming position 15 to the ridge-stripe forming position 15 is smaller than that of gallium atoms over the distance $d_2$ from the resonator-edge forming positions 13 and 14, unlike in the center in the resonator length direction.

As a result, the indium content of the active layer 19 varies in the resonator length direction, being lower between each pair of insulating film masks 16 near the resonator-edge forming positions 13 and 14 than in other regions. Accordingly, the bandgap energy is larger near the resonator-edge forming positions 13 and 14 than in other regions. Thus, the regions of the active layer 19 with the larger bandgap energy serve as an edge window structure.

Afterwards, a desired GaN-based semiconductor laser is produced through the remaining process as in the first embodiment.

The fifth embodiment provides advantages similar to those of the first embodiment.

7. Sixth Embodiment

Semiconductor Laser and Method for Producing Semiconductor Laser

The sixth embodiment differs from the first to fifth embodiments in the shape and positions of the insulating film masks 16. In other respects, the sixth embodiment is similar to the first embodiment.

Figure 18:
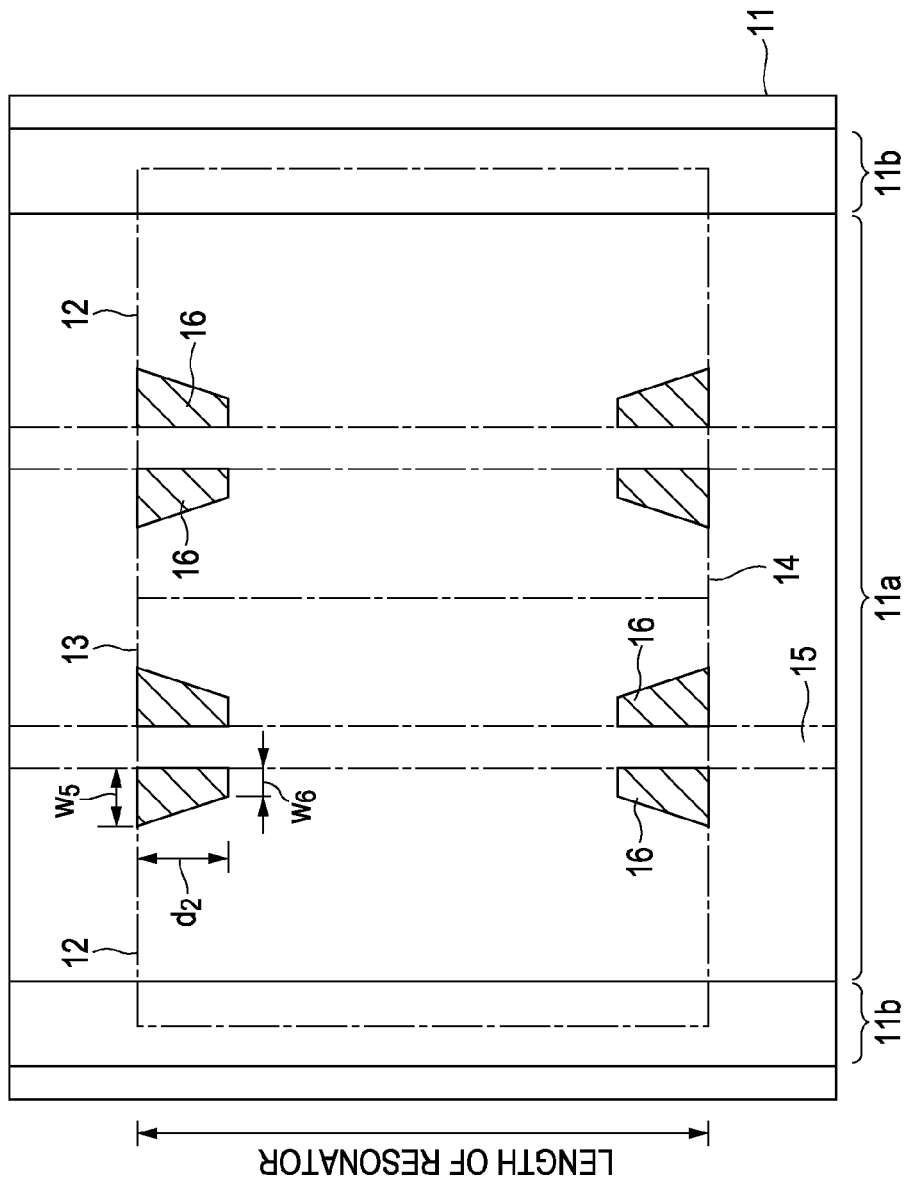
FIG. 18 is a plan view showing a method for producing a GaN-based semiconductor laser according to a sixth embodiment of the present invention.

In the sixth embodiment, first, as shown in FIG. 18, the insulating film masks 16 are formed in a trapezoidal planar shape on the n-type GaN substrate 11 on both sides of each ridge-stripe forming position 15 near the resonator-edge forming positions 13 and 14.

The insulating film masks 16 are symmetrical with respect to the ridge-stripe forming position 15 and are symmetrical with respect to the center line of the first region 11a between the two adjacent second regions 11b. An edge of each insulating film mask 16 opposite the ridge-stripe forming position 15 agrees with an edge of the ridge-stripe forming position 15.

The width of the insulating film masks 16 decreases linearly from $w_5$ to $w_6$ over the distance $d_2$ from the resonator-edge forming positions 13 and 14. For example, $d_2$ is 20 to 50 µm, $w_5$ is 10 to 20 µm, and $w_6$ is 5 µm, although they are not limited.

Next, as in the first embodiment, the GaN-based semiconductor layer 25 forming a laser structure is grown on the n-type GaN substrate 11 with the insulating film masks 16 by, for example, MOCVD.

For the active layer 19, which contains indium and gallium, because the diffusion distance of indium atoms is about one order of magnitude smaller than that of gallium atoms, the number of indium atoms supplied from the insulating film masks 16 on both sides of the ridge-stripe forming position 15 to the ridge-stripe forming position 15 is smaller than that of gallium atoms over the distance $d_2$ from the resonator-edge forming positions 13 and 14, unlike in the center in the resonator length direction.

As a result, the indium content of the active layer 19 varies in the resonator length direction, being lower between each pair of insulating film masks 16 near the resonator-edge forming positions 13 and 14 than in other regions. Accordingly, the bandgap energy is larger near the resonator-edge forming positions 13 and 14 than in other regions. Thus, the regions of the active layer 19 with the larger bandgap energy serve as an edge window structure.

Afterwards, a desired GaN-based semiconductor laser is produced through the remaining process as in the first embodiment.

The sixth embodiment provides advantages similar to those of the first embodiment.

8. Seventh Embodiment

Semiconductor Laser and Method for Producing Semiconductor Laser

In the seventh embodiment, the insulating film masks 16 are not directly formed on the n-type GaN substrate 11; for example, in any of the first to sixth embodiments, the insulating film masks 16 are formed on the n-type AlGaN cladding layer 17 after the n-type AlGaN cladding layer 17 is epitaxially grown over the entire surface of the n-type GaN substrate 11.

Figure 19:
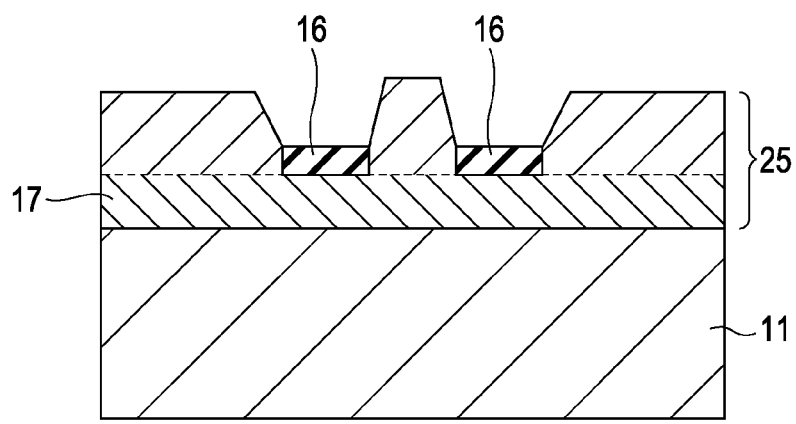
FIG. 19 is a sectional view showing a method for producing a GaN-based semiconductor laser according to a seventh embodiment of the present invention.

Subsequently, as in the first embodiment, the n-type GaN waveguide layer 18, the active layer 19, the undoped InGaN waveguide layer 20, the undoped AlGaN waveguide layer 21, the p-type AlGaN electron barrier layer 22, the p-type GaN/undoped AlGaN superlattice cladding layer 23, and the p-type GaN contact layer 24 are epitaxially grown. An example of the n-type GaN substrate 11 after the growth is shown in FIG. 19 (example corresponding to the fourth embodiment).

Afterwards, a desired GaN-based semiconductor laser is produced through the remaining process as in the first embodiment.

The seventh embodiment provides advantages similar to those of the first embodiment.

9. Eighth Embodiment

Semiconductor Laser and Method for Producing Semiconductor Laser

A GaN-based semiconductor laser according to the eighth embodiment has an edge window structure and a ridge-stripe structure, but differs from that of the first embodiment in that no non-current-injected regions are formed at the edges of the resonator. In other respects, the eighth embodiment is similar to the first embodiment.

The eighth embodiment provides advantages similar to those of the first embodiment excluding those provided by forming non-current-injected regions at the edges of the resonator.

10. Ninth Embodiment

Semiconductor Laser and Method for Producing Semiconductor Laser

Figure 20:
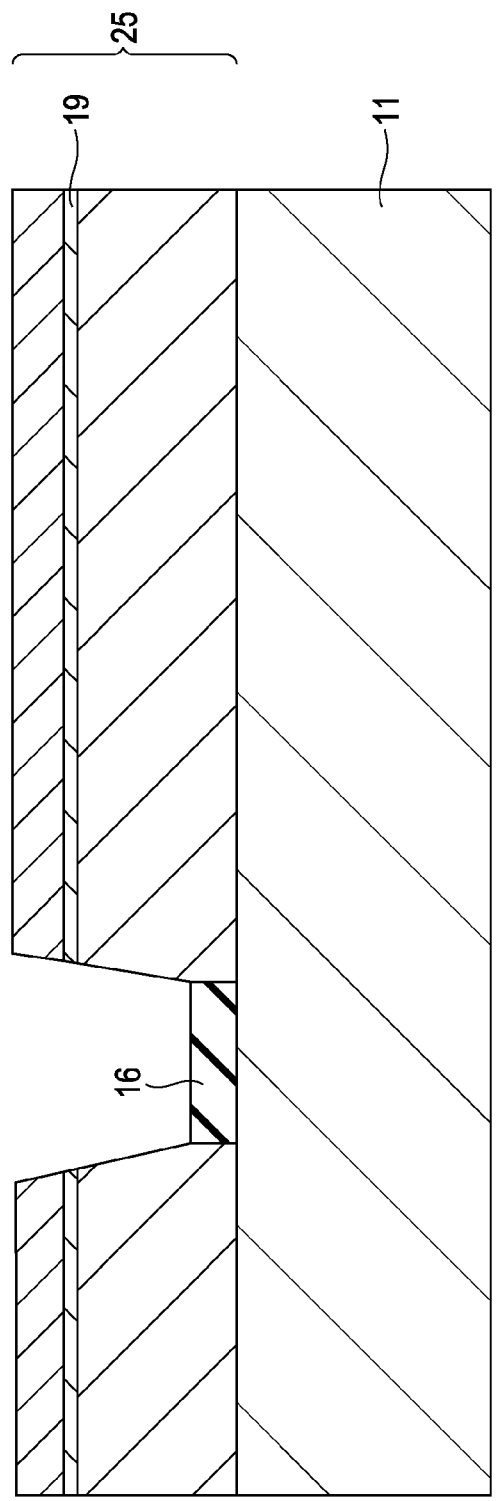
FIG. 20 is a sectional view showing a method for producing a GaN-based semiconductor laser according to a ninth embodiment of the present invention.

In the ninth embodiment, as shown in FIG. 20, the process proceeds as in the fourth embodiment, thus growing the GaN-based semiconductor layer 25 forming a laser structure, including the active layer 19, in the region not covered by the insulating film masks 16 on the n-type GaN substrate 11. Because the GaN-based semiconductor layer 25 does not substantially grow on the insulating film masks 16, recesses are formed above the insulating film masks 16.

Next, an insulating film (not shown), such as a $SiO_2$ film, is formed on the GaN-based semiconductor layer 25 and the insulating film masks 16 and is etched into a predetermined pattern.

Figure 21:
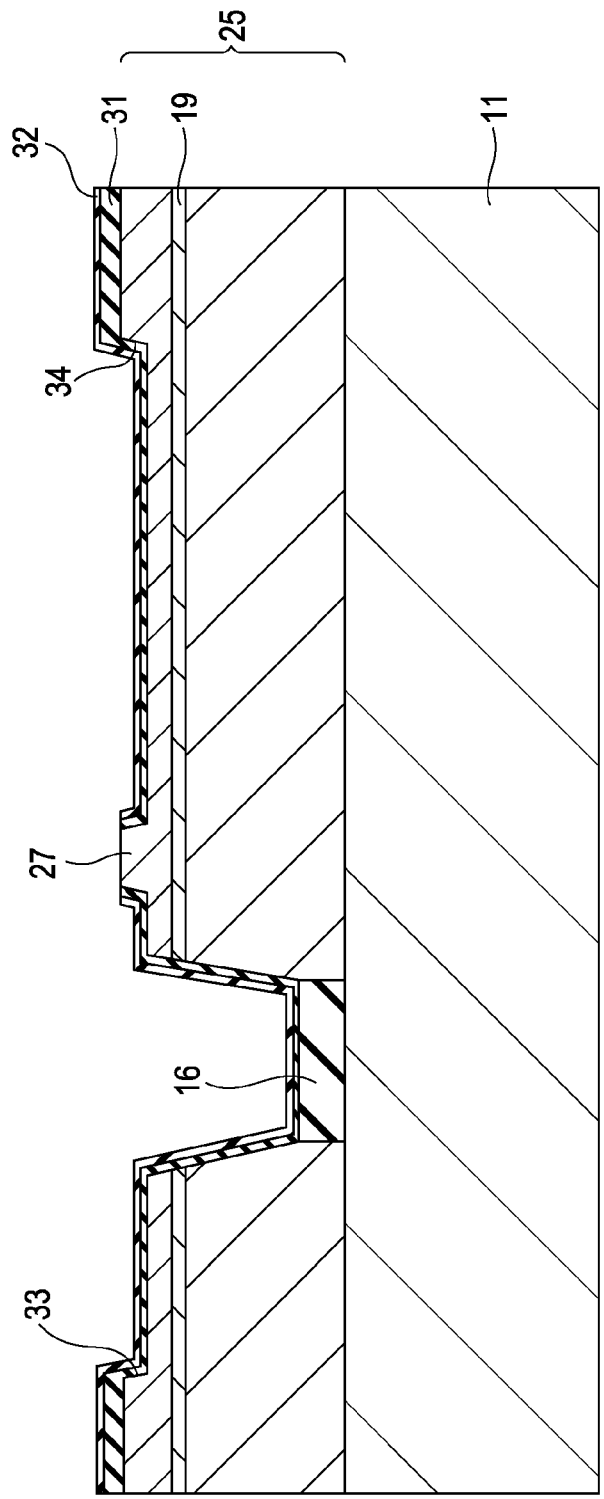
FIG. 21 is a sectional view showing the method for producing a GaN-based semiconductor laser according to the ninth embodiment of the present invention.

Next, as shown in FIG. 21, grooves 33 and 34 are formed by etching the GaN-based semiconductor layer 25 to a predetermined depth by a dry process, for example, by RIE with a chlorinated etching gas, using the insulating film as an etching mask. The ridge stripes 27 are formed between the grooves 33 and 34.

Next, while the insulating film used as an etching mask remains, an insulating film 31, such as a $SiO_2$ film, and an insulating film 32, such as an undoped silicon film, are sequentially formed over the entire surface. A resist pattern (not shown) having openings in regions corresponding to the ridge stripes 27 is formed by lithography and is used as masks to selectively remove portions of the insulating films 31 and 32 above the ridge stripes 27 by etching.

Subsequently, the resist pattern is removed. The insulating films 31 and 32 formed outside the grooves 33 and 34 are thick as a whole. The insulating film 31 outside the grooves 33 and 34 includes the insulating film used as an etching mask.

Figure 22:
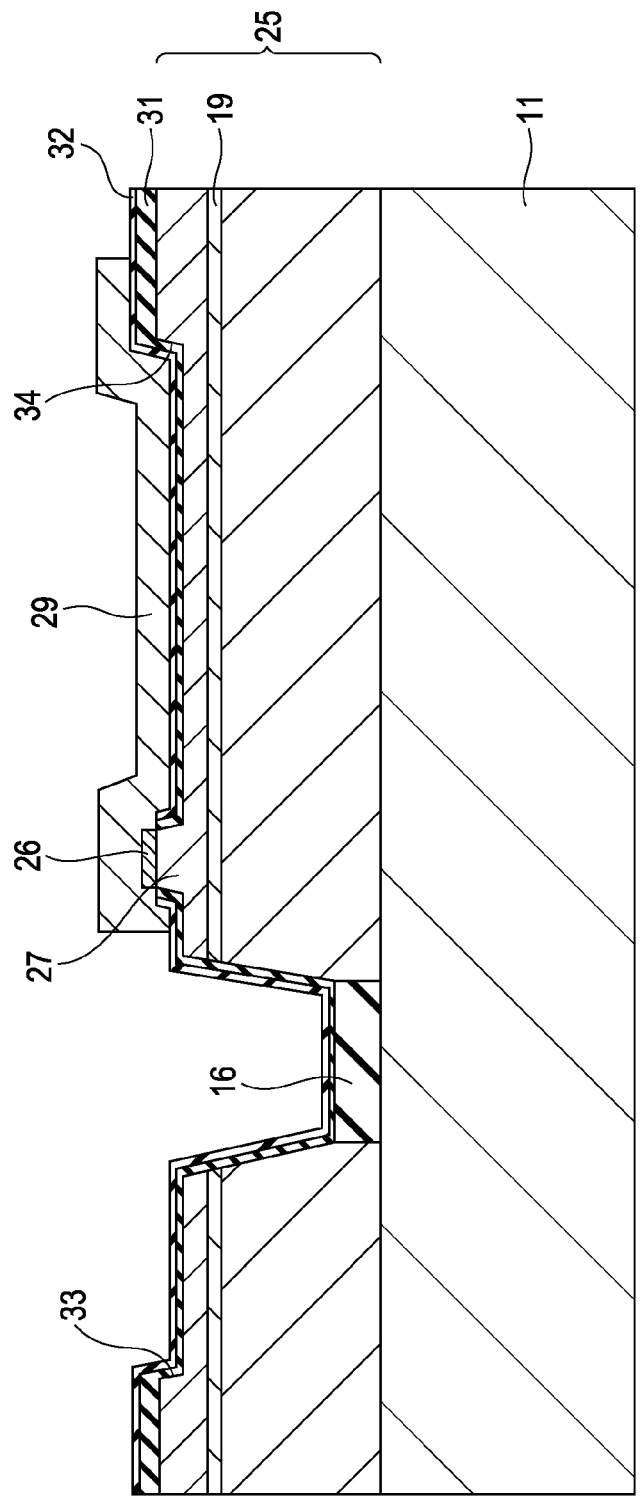
FIG. 22 is a sectional view showing the method for producing a GaN-based semiconductor laser according to the ninth embodiment of the present invention.
Figure 23:
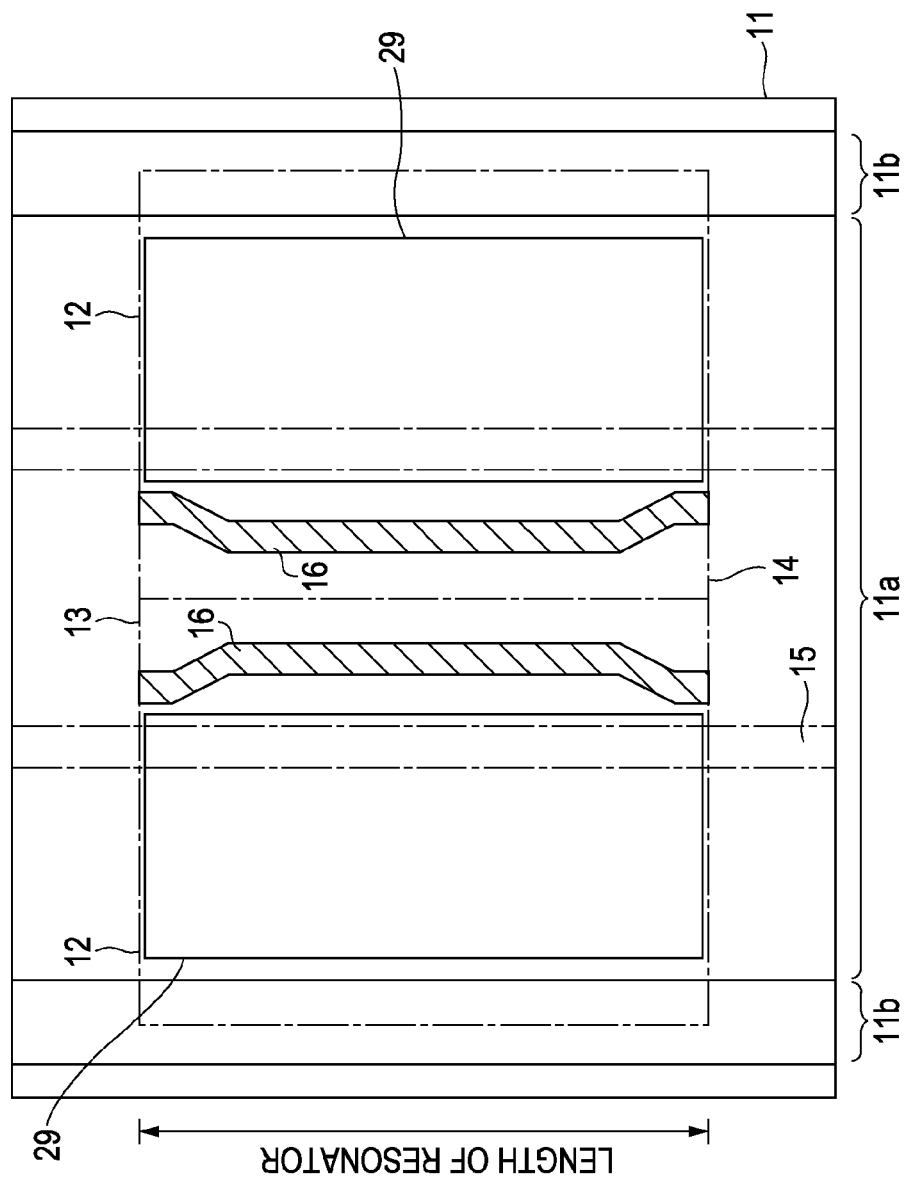
FIG. 23 is a plan view showing the method for producing a GaN-based semiconductor laser according to the ninth embodiment of the present invention.

Next, as shown in FIG. 22, the p-side electrodes 26 are formed on the ridge stripes 27, and the pad electrodes 29 are formed so as to cover the p-side electrodes 26. FIG. 23 shows the n-type GaN substrate 11 in this state in a plan view corresponding to FIG. 9.

The pad electrodes 29 are electrically connected to the ridge stripes 27 via the p-side electrodes 26. The pad electrodes 29 are formed so as to extend over substantially entire surfaces that are substantially flat in regions on the sides of the ridge stripes 27 facing away from the insulating film masks 16. The pad electrodes 29 are formed so as to be excluded from the recesses formed above the insulating film masks 16 and regions above the second regions 11b of the n-type GaN substrate 11.

For wire bonding of the pad electrodes 29 in mounting of the GaN-based semiconductor laser, preferably, the width of the pad electrodes 29 in the direction perpendicular to the resonator length direction is set to, for example, 45 μm or more from the edges of the ridge stripes 27 to ensure sufficiently large bonding regions.

Afterwards, a desired GaN-based semiconductor laser is produced through the remaining process.

The ninth embodiment provides the following advantage in addition to advantages similar to those of the fourth embodiment.

The pad electrodes 29 are formed on the substantially flat surfaces in the regions on the sides of the ridge stripes 27 facing away from the insulating film masks 16 so as to be excluded from the recesses formed above the insulating film masks 16 after the growth of the GaN-based semiconductor layer 25 in the region not covered by the insulating film masks 16 on the n-type GaN substrate 11. This allows the pad electrodes 29 to be successfully formed without, for example, being broken at steps, thus significantly reducing current leakage due to, for example, breakage of the pad electrodes 29 at steps.

11. Tenth Embodiment

Semiconductor Laser and Method for Producing Semiconductor Laser

Figure 24:
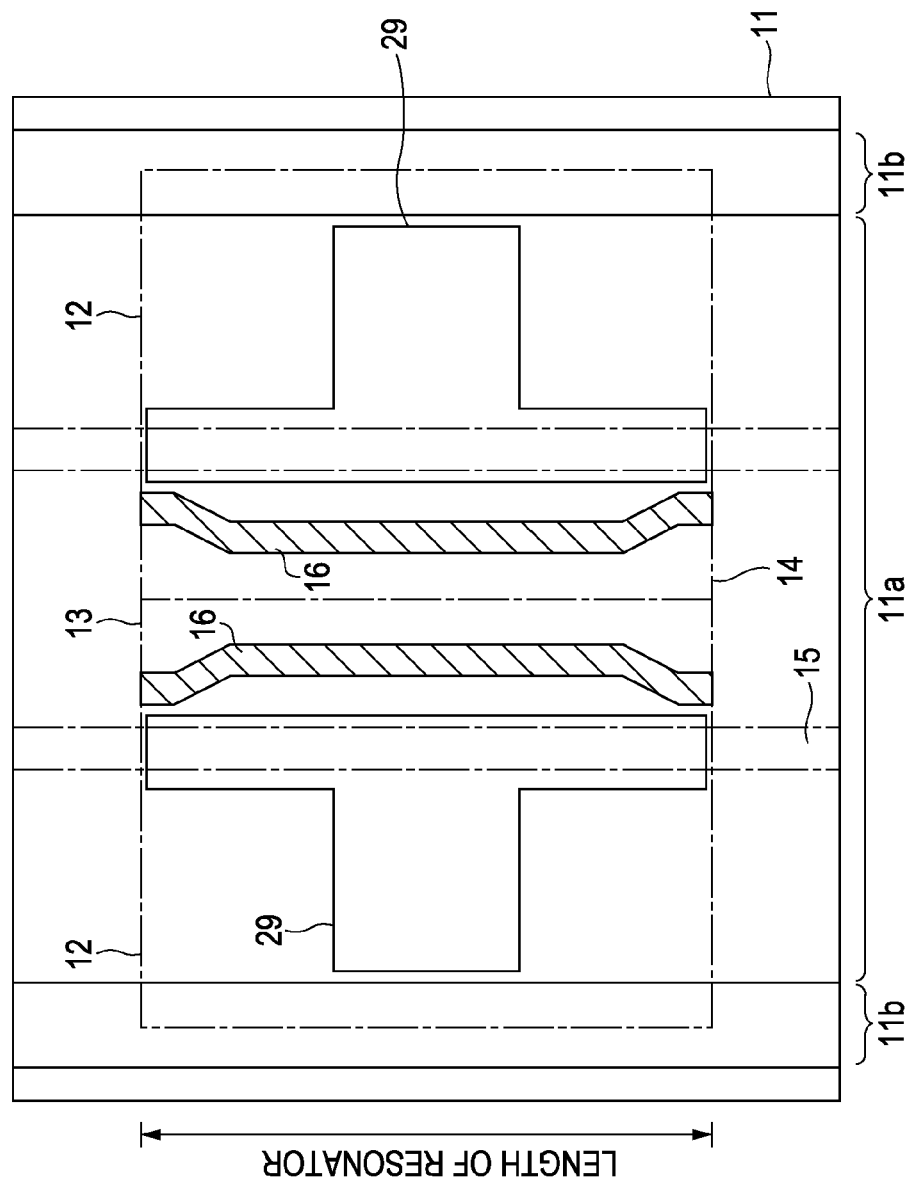
FIG. 24 is a plan view showing a method for producing a GaN-based semiconductor laser according to a tenth embodiment of the present invention.

In the tenth embodiment, as shown in FIG. 24, the process proceeds as in the ninth embodiment, thus forming the pad electrodes 29 so as to cover the p-side electrodes 26.

The pad electrodes 29 include linear portions formed above the ridge stripes 27 and rectangular portions formed so as to extend from the linear portions across the substantially flat surfaces in the regions on the sides of the ridge stripes 27 facing away from the insulating film masks 16.

The rectangular portions of the pad electrodes 29 are formed in the center in the resonator length direction in FIG. 24, although they may be formed at any position in the resonator length direction. In addition, the pad electrodes 29 are formed so as to be excluded from the recesses formed above the insulating film masks 16 and the regions above the second regions 11b of the n-type GaN substrate 11.

For wire bonding of the pad electrodes 29 in mounting of the GaN-based semiconductor laser, preferably, the width of the pad electrodes 29 in the direction perpendicular to the resonator length direction is set to, for example, 45 μm or more from the edges of the ridge stripes 27 to ensure sufficiently large bonding regions.

Afterwards, a desired GaN-based semiconductor laser is produced through the remaining process.

The tenth embodiment provides the following advantages in addition to advantages similar to those of the fourth embodiment.

The pad electrodes 29 are formed on the substantially flat surfaces in the regions on the sides of the ridge stripes 27 facing away from the insulating film masks 16 so as to be excluded from the recesses formed above the insulating film masks 16 after the growth of the GaN-based semiconductor layer 25 in the region not covered by the insulating film masks 16 on the n-type GaN substrate 11. This allows the pad electrodes 29 to be successfully formed without, for example, being broken at steps, thus significantly reducing current leakage due to, for example, breakage of the pad electrodes 29 at steps.

In addition, the area of the pad electrodes 29 can be minimized, thus reducing parasitic capacitance occurring between the pad electrodes 29 and the underlying structure. This embodiment is therefore advantageous for driving of the GaN-based semiconductor laser with a high-frequency current.

12. Eleventh Embodiment

Semiconductor Laser and Method for Producing Semiconductor Laser

In the eleventh embodiment, the pad electrodes 29 are formed as in the ninth embodiment in the process of the second embodiment.

The eleventh embodiment provides advantages similar to those of the first and ninth embodiments.

13. Twelfth Embodiment

Semiconductor Laser and Method for Producing Semiconductor Laser

In the twelfth embodiment, the pad electrodes 29 are formed as in the tenth embodiment in the process of the second embodiment.

The twelfth embodiment provides advantages similar to those of the first and tenth embodiments.

While the embodiments of the present invention have been specifically described above, the invention is not limited to those embodiments; various modifications are permitted on the basis of the technical idea of the invention.

For example, the values, structures, substrates, processes, and so on in the above embodiments are merely illustrative, and different values, structures, substrates, processes, and so on may be used where appropriate.

Specifically, for example, although the edges of the insulating film masks 16 are positioned along the edges of the ridge-stripe forming positions 15 in the first, second, third, fifth, and sixth embodiments, the insulating film masks 16 may be formed such that the edges of the insulating film masks 16 are separated from the edges of the ridge-stripe forming positions 15.

In addition, two or more of the above first to twelfth embodiments may be combined where appropriate.

The present application contains subject matter related to that disclosed in Japanese Priority Patent Application JP 2008-252364 filed in the Japan Patent Office on Sep. 30, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser having an edge window structure, comprising:
   a nitride-based III-V compound semiconductor substrate including a first region formed of a single crystal and having a first average dislocation density and a second region having a second average dislocation density higher than the first average dislocation density and disposed along a side parallel to a resonator length direction;
   a mask of an insulating film disposed on the nitride-based III-V compound semiconductor substrate at least at a position corresponding to the edge window structure; and
   a nitride-based III-V compound semiconductor layer including an active layer and grown in a region not covered by the mask on the nitride-based III-V compound semiconductor substrate,
   wherein,
      the mask has a first end and a second end in the resonator length direction,
      the first end of the mask is positioned at a resonator-edge forming position and a first portion of the mask extends from the first end over a given distance in the resonator length direction, the first portion having a first width that is constant starting at the first end and continuing over the given distance in the resonator length direction, and
      a second portion of the mask has a second width that decreases linearly, in the resonator length direction, from the first width to a zero width at the second end.

2. The semiconductor laser of claim 1, wherein the mask is disposed by each of two edges of a resonator in the resonator length direction.

3. The semiconductor laser of claim 1, wherein the mask is disposed on each side of a ridge stripe formed on the nitride-based III-V compound semiconductor substrate.

4. The semiconductor laser of claim 1, wherein the mask is disposed on the first region of the nitride-based III-V compound semiconductor substrate.

5. An optical pickup device including a semiconductor laser having an edge window structure as a light source, the semiconductor laser comprising:
   a nitride-based III-V compound semiconductor substrate including a first region formed of a single crystal and having a first average dislocation density and a second region having a second average dislocation density higher than the first average dislocation density and disposed along a side parallel to a resonator length direction;
   a mask of an insulating film disposed on the nitride-based III-V compound semiconductor substrate at least at a position corresponding to the edge window structure; and
   a nitride-based III-V compound semiconductor layer including an active layer and grown in a region not covered by the mask on the nitride-based III-V compound semiconductor substrate,
   wherein,
      the mask has a first end and a second end in the resonator length direction,
      the first end of the mask is positioned at a resonator-edge forming position and a first portion of the mask extends from the first end over a given distance in the resonator length direction, the first portion having a first width that is constant starting at the first end and continuing over the given distance in the resonator length direction, and
      a second portion of the mask has a second width that decreases linearly, in the resonator length direction, from the first width to a zero width at the second end.

6. The optical pickup device of claim 5, wherein the mask is disposed by each of two edges of a resonator in the resonator length direction.

7. The optical pickup device of claim 5, wherein the mask is disposed on each side of a ridge stripe formed on the nitride-based III-V compound semiconductor substrate.

8. The optical pickup device of claim 5, wherein the mask is formed on the first region of the nitride-based III-V compound semiconductor substrate.

9. An optical disk drive including a semiconductor laser having an edge window structure as a light source, the semiconductor laser comprising:
   a nitride-based III-V compound semiconductor substrate including a first region formed of a single crystal and having a first average dislocation density and a second region having a second average dislocation density higher than the first average dislocation density and disposed along a side parallel to a resonator length direction;
   a mask of an insulating film disposed on the nitride-based III-V compound semiconductor substrate at least at a position corresponding to the edge window structure; and
   a nitride-based III-V compound semiconductor layer including an active layer and grown in a region not covered by the mask on the nitride-based III-V compound semiconductor substrate,
   wherein,
      the mask has a first end and a second end in the resonator length direction,
      the first end of the mask is positioned at a resonator-edge forming position and a first portion of the mask extends from the first end over a given distance in the resonator length direction, the first portion having a first width that is constant starting at the first end and continuing over the given distance in the resonator length direction, and
      a second portion of the mask has a second width that decreases linearly, in the resonator length direction, from the first width to a zero width at the second end.

10. The optical disk drive of claim 9, wherein the mask is disposed by each of two edges of a resonator in the resonator length direction.

11. The optical disk drive of claim 9, wherein the mask is disposed on each side of a ridge stripe formed on the nitride-based III-V compound semiconductor substrate.

12. The optical disk drive of claim 9, wherein the mask is disposed on the first region of the nitride-based III-V compound semiconductor substrate.

* * * * *